United States Patent
Smith, Jr. et al.

(10) Patent No.: US 11,923,322 B2
(45) Date of Patent: **\*Mar. 5, 2024**

(54) INTEGRATED TUNABLE FILTER ARCHITECTURE

(71) Applicant: pSemi Corporation, San Diego, CA (US)

(72) Inventors: William R. Smith, Jr., Lake in the Hills, IL (US); Jaroslaw Adamski, Streamwood, IL (US); Dan William Nobbe, Crystal Lake, IL (US); Edward Nicholas Comfoltey, San Diego, CA (US); Jingbo Wang, San Diego, CA (US)

(73) Assignee: pSemi Corporation, San Diego, CA (US)

( \* ) Notice: Subject to any disclaimer, the term of this patent is extended or adjusted under 35 U.S.C. 154(b) by 161 days.

This patent is subject to a terminal disclaimer.

(21) Appl. No.: 17/544,722

(22) Filed: Dec. 7, 2021

(65) Prior Publication Data

US 2022/0173058 A1    Jun. 2, 2022

Related U.S. Application Data

(60) Continuation of application No. 16/596,626, filed on Oct. 8, 2019, now Pat. No. 11,211,344, which is a
(Continued)

(51) Int. Cl.
*H01L 23/66* (2006.01)
*H03H 7/01* (2006.01)
(Continued)

(52) U.S. Cl.
CPC ............. *H01L 23/66* (2013.01); *H03H 7/01* (2013.01); *H03H 7/0153* (2013.01); *H03H 7/06* (2013.01);
(Continued)

(58) Field of Classification Search
CPC ...... H03H 7/12; H03H 7/0161; H03H 7/0153; H03H 7/06; H03H 2007/013; H01L 23/66
(Continued)

(56) References Cited

U.S. PATENT DOCUMENTS 5,311,149 A    5/1994    Wagner
6,677,506 B1   1/2004    Galili et al.
(Continued)

OTHER PUBLICATIONS

Patel, Rakesh Bhaskarbhai, Office Action received from the USPTO dated Nov. 1, 2018 for U.S. Appl. No. 15/603,230, 5 pgs.
(Continued)

*Primary Examiner* — Rakesh B Patel
(74) *Attorney, Agent, or Firm* — JAQUEZ LAND GREENHAUS & MCFARLAND LLP; John Land, Esq.

(57) ABSTRACT

An apparatus and method for a frequency based integrated circuit that selectively filters out unwanted bands or regions of interfering frequencies utilizing one or more tunable notch or bandpass filters or tunable low or high pass filters capable of operating across multiple frequencies and multiple bands in noisy RF environments. The tunable filters are fabricated within the same integrated circuit package as the associated frequency based circuitry, thus minimizing R, L, and C parasitic values, and also allowing residual and other parasitic impedance in the associated circuitry and IC package to be absorbed and compensated.

19 Claims, 20 Drawing Sheets

Related U.S. Application Data division of application No. 15/603,230, filed on May 23, 2017, now Pat. No. 10,468,360, which is a division of application No. 14/181,332, filed on Feb. 14, 2014, now Pat. No. 9,673,155.

(51) Int. Cl.
*H03H 7/06* (2006.01)
*H03H 7/12* (2006.01)

(52) U.S. Cl.
CPC ............ *H03H 7/12* (2013.01); *H03H 7/1758* (2013.01); *H01L 2223/6672* (2013.01); *H01L 2924/0002* (2013.01); *H03H 2007/013* (2013.01); *H03H 2210/036* (2013.01); *Y10T 29/4913* (2015.01)

(58) Field of Classification Search
USPC .................. 333/174, 175, 181, 185; 455/428
See application file for complete search history.

(56) References Cited

U.S. PATENT DOCUMENTS

| | | | |
|---|---|---|---|
| 6,804,502 | B2 | 10/2004 | Burgener et al. |
| 7,248,120 | B2 | 7/2007 | Burgener et al. |
| 7,890,891 | B2 | 2/2011 | Stuber et al. |
| 7,910,993 | B2 | 3/2011 | Brindle et al. |
| 7,960,772 | B2 | 6/2011 | Englekirk |
| 8,682,260 | B1 | 3/2014 | Granger-Jones et al. |
| 9,118,376 | B2 | 8/2015 | Khlat |
| 9,438,196 | B2 | 9/2016 | Smith et al. |
| 9,673,155 | B2 | 6/2017 | Smith et al. |
| 10,468,360 | B2 | 11/2019 | Smith et al. |
| 11,211,344 | B2 | 12/2021 | Smith et al. |
| 2002/0047757 | A1* | 4/2002 | Manku ..................... H03H 7/07 333/170 |
| 2007/0082617 | A1 | 4/2007 | McCallister |
| 2007/0082622 | A1 | 4/2007 | Leinonen et al. |
| 2008/0076371 | A1 | 3/2008 | Dribinsky et al. |
| 2008/0107093 | A1 | 5/2008 | Meiyappan et al. |
| 2009/0174622 | A1 | 7/2009 | Kanou |
| 2009/0212887 | A1 | 8/2009 | Rofougaran |
| 2011/0002080 | A1 | 1/2011 | Ranta et al. |
| 2011/0234335 | A1 | 9/2011 | Khlat |
| 2012/0201172 | A1 | 8/2012 | Khlat et al. |
| 2012/0302188 | A1 | 11/2012 | Sahota |
| 2013/0064064 | A1 | 3/2013 | Nobbe et al. |
| 2013/0114470 | A1 | 5/2013 | Lee |
| 2013/0222075 | A1 | 8/2013 | Reedy et al. |
| 2013/0241666 | A1 | 9/2013 | Granger-Jones |
| 2013/0244591 | A1 | 9/2013 | Weissman |
| 2013/0250819 | A1 | 9/2013 | Khlat |
| 2014/0055210 | A1 | 2/2014 | Black et al. |
| 2014/0184336 | A1 | 7/2014 | Nobbe et al. |
| 2014/0184337 | A1 | 7/2014 | Nobbe et al. |
| 2014/0266433 | A1 | 9/2014 | Nobbe et al. |
| 2014/0266455 | A1 | 9/2014 | Kaatz et al. |
| 2014/0266460 | A1 | 9/2014 | Nobbe et al. |
| 2015/0048898 | A1 | 2/2015 | Gaynor |
| 2015/0091656 | A1 | 4/2015 | Gaynor |
| 2015/0235971 | A1 | 8/2015 | Smith et al. |
| 2015/0236671 | A1 | 8/2015 | Smith et al. |
| 2015/0236748 | A1 | 8/2015 | Nobbe |
| 2015/0236798 | A1 | 8/2015 | Nobbe |
| 2015/0311922 | A1 | 10/2015 | Bakalski |
| 2018/0005966 | A1 | 1/2018 | Smith et al. |
| 2020/0111756 | A1 | 4/2020 | Smith et al. |

OTHER PUBLICATIONS

Patel, Rakesh Bhaskarbhai, Office Action received from the USPTO dated Mar. 5, 2019 for U.S. Appl. No. 15/603,230, 16 pgs.
Patel, Rakesh Bhaskarbhai, Notice of Allowance received from the USPTO dated Jun. 21, 2019 for U.S. Appl. No. 15/603,230, 9 pgs.
Faneian, Erfan, Office Action received from the USPTO dated Sep. 8, 2015 for U.S. Appl. No. 14/181,332, 7 pgs.
Patel. Rakesh Bhaskarbhai, Office Action received from the USPTO dated Feb. 3, 2016 for U.S. Appl. No. 14/181,332, 37 pgs.
Patel. Rakesh Bhaskarbhai, Final Office Action received from the USPTO dated Sep. 28, 2016 for U.S. Appl. No. 14/181,332, 19 pgs.
Patel. Rakesh Bhaskarbhai, Advisory Action received from the USPTO dated Jan. 11, 2017 for U.S. Appl. No. 14/181,332, 3 pgs.
Patel. Rakesh Bhaskarbhai, Notice of Allowance received from the USPTO dated Mar. 15, 2017 for U.S. Appl. No. 14/181,332, 20 pgs.
Smith, et al., Response filed in the USPTO dated Dec. 8, 2015 for U.S. Appl. No. 14/181,332, 5 pgs.
Smith, et al., Response filed in the USPTO dated Jun. 3, 2016 for U.S. Appl. No. 14/181,332, 13 pgs.
Smith, et al., Response filed in the USPTO dated Dec. 28, 2016 for U.S. Appl. No. 14/181,332, 58pgs.
Smith, et al., Preliminary Amendment filed in the USPTO dated Jan. 30, 2017 for U.S. Appl. No. 14/181,332, 8 pgs.
Lu, Zhiyu, Office Action received from the USPTO dated May 17, 2017 for U.S. Appl. No. 14/181,478, 17 pgs.
Nobbe, Dan, Response filed in the USPTO dated Jul. 17, 2017 for U.S. Appl. No. 14/181,478, 14 pgs.
Lu, Zhiyu, Final Office Action received from the USPTO dated Sep. 15, 2017 for U.S. Appl. No. 14/181,478, 19 pgs.
Nobbe, Dan, Response filed in the USPTO dated Sep. 21, 2017 for U.S. Appl. No. 14/181,478, 13 pgs.
Lu, Zhiyu, Advisory Action received from the USPTO dated Oct. 3, 2017 for U.S. Appl. No. 14/181,478, 5 pgs.
Lu, Zhiyu, Office Action received from the USPTO dated Nov. 29, 2017 for U.S. Appl. No. 14/181,478, 14 pgs.
PSemi Corporation, Response filed in the USPTO dated Nov. 6, 2018 for U.S. Appl. No. 15/603,230, 10 pgs.
PSemi Corporation, Response filed in the USPTO dated Mar. 5, 2019 for U.S. Appl. No. 15/603,230, 11 pgs.
Nobbe, Dan, Response After Final filed in the USPTO dated Feb. 2, 2017 for U.S. Appl. No. 14/181,478, 14 pgs.
Lu, Zhiyu, Advisory Action received from the USPTO dated Feb. 10, 2017 for U.S. Appl. No. 14/181,478, 4 pgs.
Lu, Zhiyu, Final Office Actin received from the USPTO dated Dec. 5, 2016 for U.S. Appl. No. 14/181,478, 24 pgs.
Nobbe, Dan, Response filed in the USPTO dated Oct. 13, 2016 for U.S. Appl. No. 14/181,478, 12 pgs.
Lu, Zhiyu, Office Action received from the USPTO dated Jun. 13, 2016 for U.S. Appl. No. 14/181,478, 34 pgs.
Lu, Zhiyu, Office Action received from the USPTO dated Mar. 30, 2016 for U.S. Appl. No. 14/181,478, 8 pgs.
Nobbe, Dan, Response to Restriction Requirement filed in the USPTO dated May 13, 2016 for U.S. Appl. No. 14/181,478, 5 pgs.
Smith, et al., Amendment filed in the USPTO dated Dec. 16, 2015 for U.S. Appl. No. 14/462,219, 10 pgs.
Zweizig, Jeffery Shawn, Office Action received from the USPTO dated Sep. 18, 2015 for U.S. Appl. No. 14/462,219, 13 pgs.
Pham, Tuan, Office Action received from the USPTO dated Oct. 2, 2015 for U.S. Appl. No. 14/181,489, 19 pgs.
Nobbe, Dan, Amendment filed in the USPTO dated Sep. 16, 2015 for U.S. Appl. No. 14/181,489, 13 pgs.
Pham, Tuan, Office Action received from the USPTO dated Jun. 17, 2015 for U.S. Appl. No. 14/181,489, 29 pgs.
He, et al., "A 2.5-GHz Low-Power, High Dynamic Range, Self-Tuned Q-Enhanced LC Filter in SOI", IEEE Journal of Solid-State Circuits, vol. 40, No. 8, Aug. 2005, pp. 1618-1628.
Kuhn, et al., "A 200 MHz CMOS Q-Enhanced LC Bandpass Filter", IEEE Journal of Solid-State Circuits, vol. 31, No. 8, Aug. 1996, pp. 1112-1122.
Kuhn William B., "Dynamic Range Performance of On-Chip RF Bandpass Filters" IEEE Transactions on Circuits and Systems—II: Analog and Digital Signal Processing, vol. 50, No. 10, Oct. 2003, pp. 685-694.
Kuhn William B., "Q-Enhanced LC Bandpass Filters for Integrated Wireless Applications", IEEE Transactions on Microwave Theory and Techniques, vol. 46, No. 12, Dec. 1998, pp. 2577-2586.

(56) References Cited

OTHER PUBLICATIONS

Nobbe, et al., "Scalable Periphery Tunable Matching Power Amplifier", Applications and Figures as filed in the USPTO on Mar. 12, 2013 for U.S. Appl. No. 13/797,779, 89 pgs.

Gaynor, Michael, "Methods and Devices for Impedance Matching in Power Amplifier Circuits", Application and Figures as filed in the USPTO on Sep. 27, 2013 for U.S. Appl. No. 14/042,312, 40 pgs.

Nobbe, et al., "Systems and Methods for Optimizing Amplifier Operations", Application and Figures as filed in the USPTO on Mar. 14, 2013 for U.S. Appl. No. 13/828,121, 29 pgs.

Gaynor, Michael, "Tunable Impedance Matching Network", Application and Figures as filed in the USPTO on Aug. 15, 2013 for U.S. Appl. No. 13/967,866, 36 pgs.

Kaatz, et al., "Variable Impedance Match and Variable Harmonic Terminations for Different Modes and Frequency Bands", Application and Figures as filed in the USPTO on Mar. 12, 2013 for U.S. Appl. No. 13/797,686, 42 pgs.

Gaynor, Michael, "Methods and Devices for Thermal Control in Power Amplifier Circuits", Application and Figures as filed in the USPTO on Sep. 30, 2013 for U.S. Appl. No. 14/042,331, 38 pgs.

Nobbe, et al., "Amplifier Dynamic Bias Adjustment for Envelope Tracking", Application and Figures as filed in the USPTO on Mar. 14, 2013 for U.S. Appl. No. 13/829,946, 177 pgs.

Nobbe, et al., "Control Systems and Methods for Power Amplifiers Operating in Envelope Tracking Mode", Application and Figures as filed in the USPTO on Mar. 14, 2013 for U.S. Appl. No. 13/830,555, 169 pgs.

Gaynor, et al., "Antenna Transmit Receive Switch", Application and Figures as filed in the USPTO on Sep. 27, 2013 for U.S. Appl. No. 14/040,471, 54 pgs.

Nobbe, Dan, "Devices and Methods for Duplexer Loss Reduction", Application and Figures as filed in the USPTO on Feb. 14, 2014 for U.S. Appl. No. 14/181,489, 33 pgs.

Nobbe, Dan, "Methods for Increasing RF Throughput Via Usage of Tunable Filters", Application and Figures as filed In the USPTO on Feb. 14, 2014 for U.S. Appl. No. 14/181,478, 52 pgs.

Zweizig, Jeffery Shawn, Notice of Allowance received from the USPTO dated May 3, 2016 for U.S. Appl. No. 14/462,219, 10 pgs.

Nguyen, Hieu P., Notice of Allowance received from the USPTO dated Apr. 22, 2020 for U.S. Appl. No. 16/408,001, 11 pgs.

Patel, Rakesh Bhaskarbhai, Office Action received from the USPTO dated Jun. 3, 2021 for U.S. Appl. No. 16/596,626, 21 pgs.

Patel, Rakesh Bhaskarbhai, Notice of Allowance received from the USPTO dated Aug. 23, 2021 for U.S. Appl. No. 16/596,626, 5 pgs.

\* cited by examiner

Notch Filter with Spiral Inductor

Frequency response with notch filter turned OFF

Frequency response with notch filter turned ON

Tunable Low Pass Filter
(TLPF)

INTEGRATED TUNABLE FILTER ARCHITECTURE

CROSS REFERENCE TO RELATED APPLICATIONS—CLAIM OF PRIORITY

The present application is a continuation of, and claims priority to, co-pending and commonly assigned U.S. patent application Ser. No. 16/596,626, filed Oct. 8, 2019, entitled "Integrated Tunable Filter Architecture", the entire disclosure of which is incorporated herein by reference. Application Ser. No. 16/596,626 is a divisional of, and claims priority to, commonly assigned U.S. patent application Ser. No. 15/603,230, filed May 23, 2017, entitled "Integrated Tunable Filter Architecture", now U.S. Pat. No. 10,468,360, issued Nov. 5, 2019, the entire disclosure of which is incorporated herein by reference. Application Ser. No. 15/603,230 is a divisional of, and claims priority to, commonly assigned U.S. patent application Ser. No. 14/181,332, entitled "Integrated Tunable Filter Architecture", filed on Feb. 14, 2014, now U.S. Pat. No. 9,673,155, issued Jun. 6, 2017, the entire disclosure of which is incorporated herein by reference.

The present application may be related to the following patent applications, assigned to the assignee of the present invention, the entire disclosures of which are incorporated herein by reference:

(1) U.S. patent application Ser. No. 12/735,954, Publication No. 2011000208A1, entitled "Method and Apparatus for Use in Digitally Tuning a Capacitor in an Integrated Circuit Device", filed on Mar. 2, 2009;

(2) International Application No. PCT/US2009/001358, entitled "Method and Apparatus for Use in Digitally Tuning a Capacitor in an Integrated Circuit Device", filed on Mar. 2, 2009;

(3) U.S. patent application Ser. No. 13/595,893, entitled "Method and Apparatus for Use in Tuning Reactance in a Circuit Device", filed on Aug. 27, 2012;

(4) U.S. patent application Ser. No. 13/797,779 entitled "Scalable Periphery Tunable Matching Power Amplifier", filed on Mar. 3, 2013;

(5) U.S. patent application Ser. No. 13/797,686 entitled "Variable Impedance Match and Variable Harmonic Terminations for Different Modes and Frequency Bands", filed on Mar. 12, 2013;

(6) U.S. patent application Ser. No. 13/828,121, entitled "Autonomous Power Amplifier Optimization", filed on Mar. 14, 2013;

(7) U.S. patent application Ser. No. 13/829,946 entitled "Amplifier Dynamic Bias Adjustment for Envelope Tracking, filed on Mar. 14, 2013;

(8) U.S. patent application Ser. No. 13/830,555 entitled "Control Systems and Methods for Power Amplifiers Operating in Envelope Tracking Mode", filed on Mar. 14, 2013;

(9) U.S. patent application Ser. No. 13/967,866 entitled "Tunable Impedance Matching Network", filed on Aug. 15, 2013;

(10) U.S. patent application Ser. No. 14/042,312, entitled "Methods and Devices for Impedance Matching in Power Amplifier Circuits", filed on Sep. 30, 2013;

(11) U.S. patent application Ser. No. 14/042,331 entitled "Methods and Devices for Thermal Control in Power Amplifier Circuits", filed on Sep. 30, 2013;

(12) U.S. patent application Ser. No. 11/520,912, entitled "Method and Apparatus Improving Gate Oxide Reliability by Controlling Accumulated Charge", filed on Sep. 14, 2006;

(13) U.S. patent application Ser. No. 11/881,816, entitled "Circuit and Method for Controlling Charge Injection in Radio Frequency Switches", filed Jul. 26, 2007;

(14) U.S. patent application Ser. No. 13/228,751, Publication No. 20130064064A1, entitled "Systems and Methods for Minimizing Insertion Loss in a Multi-Mode Communications System", filed on Sep. 9, 2011;

(15) U.S. patent application Ser. No. 14/040,471 entitled "Antenna Transmit Receive Switch", filed on Sep. 27, 2013;

(16) U.S. patent application Ser. No. 14/181,478 entitled "Methods for Increasing RF Throughput Via Usage of Tunable Filters", filed Feb. 14, 2014;

(17) U.S. patent application Ser. No. 14/181,489 entitled "Devices and Methods for Duplexer Loss Reduction", abandoned.

(18) U.S. Pat. No. 6,667,506, entitled "Variable Capacitor with Programmability", issued on Dec. 23, 2003;

(19) U.S. Pat. No. 6,804,502, entitled "Switch Circuit and Method of Switching Radio Frequency Signals", issued on Oct. 12, 2004;

(20) U.S. Pat. No. 7,248,120, entitled "Stacked Transistor Method and Apparatus", issued on Jul. 24, 2007;

(21) U.S. Pat. No. 7,910,993, entitled "Method and Apparatus for Use in Improving Linearity of MOSFETS Using an Accumulated Charge Sink", issued on Mar. 22, 2011; and

(22) U.S. Pat. No. 7,960,772, entitled "Tuning Capacitance to Enhance FET Stack Voltage Withstand", issued on Jun. 14, 2011.

BACKGROUND

(1) Technical Field

This invention generally relates to electronic circuitry, and more specifically to frequency based integrated circuits having at least one integrated tunable filter.

(2) Background

A large number of modern electronic systems, such as personal computers, tablet computers, wireless network components, televisions, cable system "set top" boxes, and cellular telephones, include frequency based subsystems such as radio frequency (RF) transceivers. Many of such RF transceivers are actually quite complex two-way radios that transmit and receive RF signals across multiple frequencies in multiple bands; for instance, the 2.4 GHz band is divided into 14 channels spaced 5 MHz apart, beginning with channel 1 which is centered on 2.412 GHz. As another example, a modern "smart telephone" may include RF transceiver circuitry capable of concurrently operating on different cellular communications systems (e.g., GSM and CDMA), on different wireless network frequencies and protocols (e.g., IEEE 802.1bg at 2.4 GHz, and IEEE 802.1n at 2.4 GHz and 5 GHz), and on "personal" area networks (e.g., Bluetooth based systems).

In addition, such RF transceivers often operate in "noisy" RF environments, which includes other devices with RF transceivers (e.g., wireless networks, cellular telephones and cell towers, and personal area networks), as well as devices that emit electromagnetic interference on frequencies of interest (e.g., microwave ovens). For example, in the United States, devices that use the 2.4 GHz band includes wireless "WiFi" networks, microwave ovens, ISM band devices, security cameras, ZigBee devices, Bluetooth devices, video senders, cordless telephones, and baby monitors.

Designing frequency based electronic systems or subsystems capable of operating across multiple frequencies and multiple bands in noisy environments is a significant challenge, particularly in integrated circuit solutions, which are desirable from a cost, reliability, size, and low power perspective. The apparatus and method described below provide a frequency based integrated circuit solution that selectively filters out unwanted bands or regions of interfering frequencies utilizing one or more integrated tunable notch or bandpass filters or tunable low or high pass filters. Various aspects of the apparatus and method described below will be seen to provide additional advantages.

SUMMARY OF THE INVENTION

The invention exemplified in the apparatus and method described below provides a frequency based integrated circuit solution that selectively filters out unwanted bands or regions of interfering frequencies utilizing one or more tunable notch or bandpass filters or tunable low or high pass filters. The invention encompasses frequency based electronic systems or subsystems capable of operating across multiple frequencies and multiple bands in noisy environments, particularly in integrated circuit form, which is desirable from a cost, reliability, size, and low power perspective.

For RF applications in particular, it is important to carefully control all aspects of the system R, L, and C components in order to minimize their impact on signal propagation. Such control is difficult or impossible in many cases when a combination of integrated circuit (IC) circuits are combined with external R, L, and C components (collectively, "RLC" components). Accordingly, an important aspect of the invention is that the tunable filters (notch or low pass) are fabricated within the same IC package as the associated frequency based circuitry. In the examples shown in the accompanying figures, such circuitry comprises an RF switch, but other circuitry may be used. Such integration reduces or eliminates package and printed circuit board (PCB) RLC parasitic values, and also allows residual and other parasitic capacitance, inductance, and resistance in the associated circuitry and package to be absorbed and compensated. For example, such integration, particularly if a digitally tunable capacitor is also integrated on the same chip to provide the desired tunability, reduces parasitic capacitances from such sources as IC pad shielding "cages", electrostatic discharge (ESD) circuits, and the IC package itself. Accordingly, the invention encompasses co-designing a frequency based circuit and one or more tunable filters such that the overall performance of the integrated combination is better than the simple combination of separate components performing the same functions.

In one example embodiment, an RF switch is implemented on an integrated circuit chip. The switch may be implemented with field effect transistor (FET) switch elements and is configured to be coupled to an external antenna through a common port. At least two switch paths or "ports" of the switch are configured to be coupled to corresponding operational RF circuits, such as RF transmitters and receivers, which may be fabricated on the same IC chip as the switch or may be located on separate circuit structures. At least one switch port is coupled to a bypassable tunable filter (notch or low pass) integrated onto the same IC chip as the switch. The tunability of the filter may be implemented using, for example, a digitally tunable capacitor circuit and/or a tunable inductance circuit. The switch is designed to couple a selected operational RF circuit to a corresponding antenna while simultaneously selectively coupling an associated tunable filter to the same signal path. Additional tunable filters (shunt or series type) may be accommodated in similar fashion, so that multiple frequency bands may be simultaneously filtered out of an operational circuit signal path.

If sufficient circuit area is available, an embodiment may forego the tunability of individual notch filters and instead provide a number of fixed frequency notch filters, utilizing the switching capability of the switch to couple one or more of such notch filters to an operational circuit signal path, thus achieving "tunability" by notch filter circuit selection rather than by L or C component value changes.

For relatively high RF frequency ranges, such as the 2.4 GHz and 5 GHz RF bands commonly used in WiFi wireless local area networks, only relatively small capacitance values are needed to achieve significant notch frequency filtering. Such small values are well suited for implementation on IC chips. For example, in one embodiment, approximately −17.2 dB of suppression centered at about 5.8 GHz can be attained with a value of 0.27 pF for the notch filter capacitance. In contrast, attempting to achieve such a degree of notch frequency filtering with an external (off-chip) notch filter is extremely difficult, if not impossible, since the necessary tuning capacitance value is small in comparison to all of the parasitic IC package and surrounding circuit capacitances.

Notably, the insertion loss impact of an RF switch with integrated tunable notch or bandpass filters or tunable low or high pass filter can be extremely small due to the ability to compensate for and absorb residual and other parasitic capacitance, inductance, and resistance. An off-chip implementation of a filter would result in a significantly larger insertion loss, typically in excess of 10 times larger than with embodiments of the present invention.

Variants of the illustrated embodiments include use of one or more shunt and/or series tunable filters, use of differential filters, placement of tunable filters closer or farther from an associated antenna, use of compensation capacitors when a tunable filter is bypassed, addition of inductors for overall circuit tuning purposes, and other aspects described below.

Other variants of the inventive concept that provide additional functionality and flexibility include the use of tunable low pass filters on the port side of an RF switch, and a tunable RF duplexer incorporating both a tunable low pass filter and a tunable high pass filter.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention exemplified in the apparatus and method described below provides a frequency based integrated circuit solution that selectively filters out unwanted bands or regions of interfering frequencies utilizing one or more tunable notch or bandpass filters or tunable low or high pass filters. The invention encompasses frequency based electronic systems or subsystems capable of operating across multiple frequencies and multiple bands in noisy environments, particularly in integrated circuit form, which is desirable from a cost, reliability, size, and low power perspective.

For RF applications in particular, it is important to carefully control all aspects of the system R, L, and C components in order to minimize their impact on signal propagation. Such control is difficult or impossible in many cases when a combination of integrated circuit (IC) circuits are combined with external R, L, and C components. Accordingly, an important aspect of the invention is that the tunable notch or bandpass filters or tunable low or high pass filters are fabricated within the same integrated circuit (IC) package (comprising one or more IC "chips", coupled by IC package circuit traces, bond wires, wireless communication circuitry, etc.) as the associated frequency based circuitry. In particular, monolithic integration reduces package and printed circuit board (PCB) R, L, and C parasitic values, and also allows residual capacitance and inductance (i.e., capacitance and inductance from passive elements such as resistors, capacitors, and inductors) and other parasitic capacitance, inductance, and resistance ("parasitic impedance") in the associated circuitry and package to be absorbed and compensated, thus eliminating or reducing the impact on signal propagation of such capacitances.

More generally, whenever there exists "parasitic" (not intentionally designed) capacitance or inductance (such as the inherent capacitance in inductor structures and inductance in capacitor structures, or package capacitance and inductance approaching the size of desired circuit values), the parasitic capacitance or inductance can usually be described as an additional capacitor or inductor in the equivalent circuit model. If it appears in series or parallel with an intentionally-designed element of the same type (capacitor or inductor), the value of the intentionally designed component can be modified (usually reduced) such that the effective value (intentional and parasitic portions combined) is restored to the originally intended value. This can be done only if the parasitic contributions are small enough so as not to exceed the desired value, which will typically be the case only if the circuit and packaging are integrated and/or co-designed.

Figure 1:
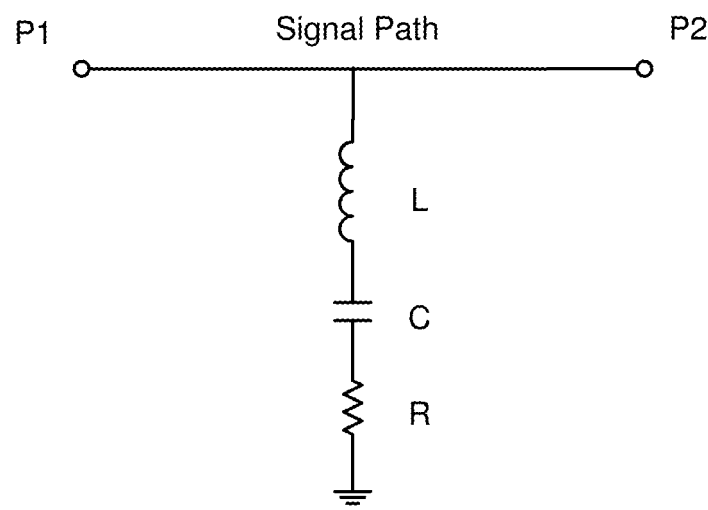
FIG. 1 is a schematic diagram of a typical notch filter as embodied in practice.

FIG. 1 is a schematic diagram of a typical fixed-value notch filter 100 as embodied in practice. As is known in the art, a notch filter is a type of band-stop or band-rejection filter that suppresses a relatively narrow band of frequencies. One type of notch filter simply comprises an inductor L and a capacitor C coupled in series between a signal path and circuit ground, as shown in FIG. 1. In practical implementations, LC notch filters also inherently include at least a "parasitic" series resistance R, as shown, thus resulting in a series "RLC" structure. Importantly, the parasitic resistance R, the total capacitance C, and the total inductance L are determined by other coupled or nearby components, and not just by the purposely fabricated L and C elements of the notch filter 100. For example, the capacitance C of the circuit shown in FIG. 1 comprises not only the value of a specific capacitor designed into the circuit, but also parasitic capacitances from coupled or surrounding components, such as the inductor L. Similarly, the inductance L comprises not only the value of a specific inductor designed into the circuit, but also parasitic inductances from coupled or surrounding components. In the same manner, the parasitic resistance R of the circuit shown in FIG. 1 includes the resistance of the inductor L, interconnecting wire or circuit traces, and any switch (e.g., FET transistor switches) element in the circuit. Accordingly, it is important in designing frequency based circuitry to account for and accommodate or compensate for such parasitic circuit elements in order to achieve desired specifications.

It should be noted that while the R and C elements shown in FIG. 1 are typically considered to be passive elements, each may be implemented by using FETs configured to behave as resistors and/or capacitors, in known fashion.

Figure 2A:
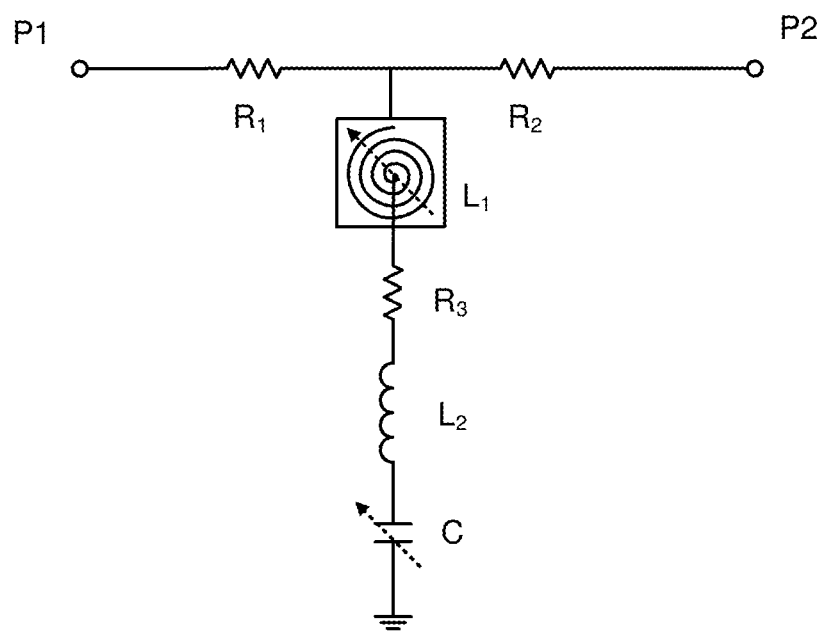
FIG. 2A is a schematic diagram of a specific tunable notch filter circuit.

FIG. 2A is a schematic diagram of a specific tunable notch filter circuit 200. In this particular example, R1 and R2 represent small parasitic resistances (e.g., about 0.01 Ohms each) in series between ports P1 and P2. The rest of the tunable notch filter circuit comprises a main inductor L1 (shown in this example as a spiral structure, discussed below, having a value of about 2.4 nH), a resistor R3 (about 3 Ohms in this example, comprising the resistance of the inductors and a coupled switch element), and a capacitor C (about 0.27 pF in this example, a notably small value). Also shown is a parasitic inductor L2 (having a value of about 0.4 nH in this example). To make the notch filter 200 tunable, either or both of the inductor L1 or the capacitor C may be adjustable over a range of values, as indicted by the dotted arrows in FIG. 2A.

An example of a suitable adjustable capacitor for C in FIG. 2A is the digitally tunable capacitor (DTC) shown in U.S. patent application Ser. No. 12/735,954, Publication No. 2011000208A1, entitled "Method and Apparatus for Use in Digitally Tuning a Capacitor in an Integrated Circuit Device", filed on Mar. 2, 2009 and assigned to the assignee of the present invention. Utilizing a variable capacitor, the notch filter shown in FIG. 2A can have its center suppression frequency varied over a considerable range of values by tuning the capacitance C included as part of the RLC notch filter circuit 200 to a desired value.

Similarly, the center suppression frequency of the RLC notch filter circuit 200 can be varied by using a tunable inductor circuit (e.g., a spiral inductor L having multiple sections which can be switched in or out of circuit to alter the circuit inductance, or multiple inductor spirals that may be selectively switched into or out of the RLC notch filter circuit to change the total inductance). In addition, a tunable notch filter may be implemented having both a variable capacitor and a variable inductor, which may provide a wider range of tuning.

Figure 2B:
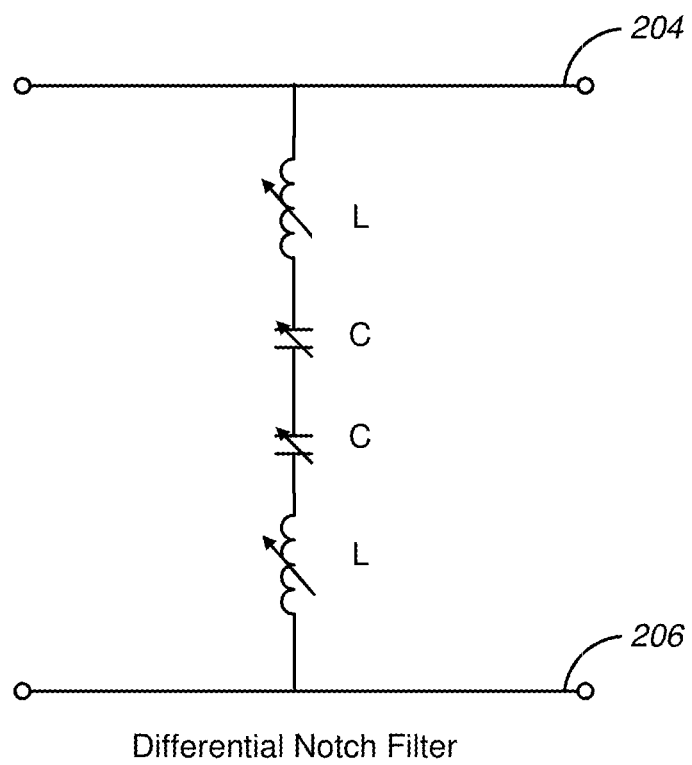
FIG. 2B is a schematic diagram of a differential configuration of a tunable notch filter.

FIG. 2B is a schematic diagram of a differential configuration of a tunable notch filter 202. The tunable notch filter 202 includes an L-C-C-L series circuit between differential signal paths 204 and 206 (in theory, the two capacitors C could be combined into one, but practical considerations for IC implementations often require a pair of capacitor structures; note also that parasitic resistances have been omitted for clarity). While all four notch filter elements are shown as tunable, only a subset (typically both capacitors C) need be tunable for most applications. A differential implementation is beneficial in mitigating parasitics such as ground inductance.

Figure 3:
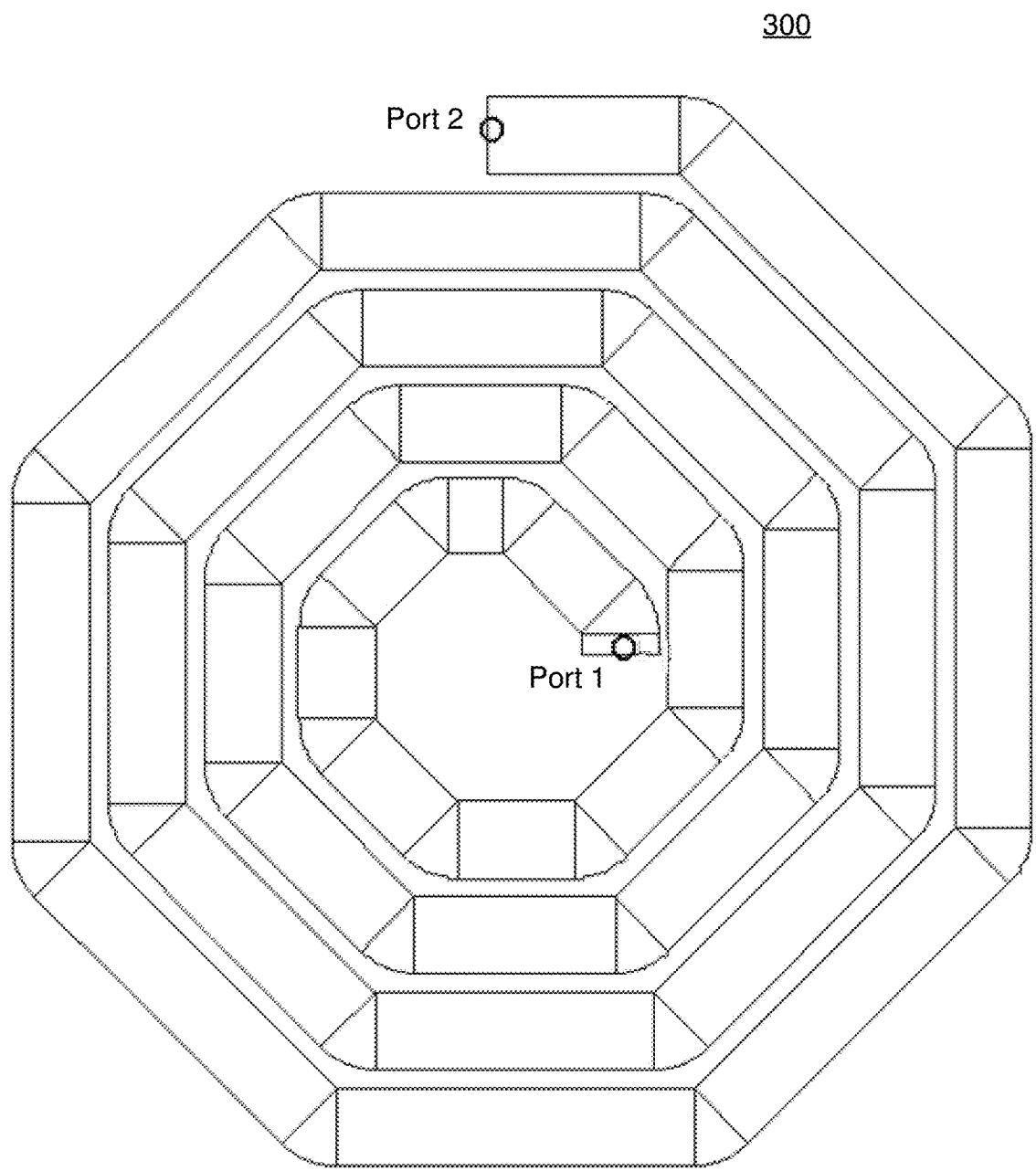
FIG. 3 is a diagram of a spiral inductor structure.

FIG. 3 is a diagram of a planar spiral inductor structure 300 that may be useful in implementing the notch filter depicted in FIG. 2A. Such a structure is particularly adapted to being fabricated on an integrated circuit. Typically, port 1 in the center of the inductor structure 300 is coupled to ground through a capacitor (not shown), and port 2 is connected to a signal path; the structure thus behaves as a shunt element to ground. However, the inductor structure 300 may also be used as a series connected element (see, for example, the discussion below regarding FIG. 15).

Structure parameters for a spiral inductor structure 300 that affect the inductance value include line width, line pitch, and number of turns, as is known in the art. The general shape of a spiral inductor may be, for example, circular, octagonal, hexagonal, square, or other suitable geometric form. The spiral inductor structure 300 may be made tunable by including multiple "taps" to portions of the spiral between illustrated port 1 and port 2, accessed by a switching structure (not shown) that enables connectivity of a subset of the spiral coils to a signal path. Alternatively, and sometimes preferably, other parts of a circuit may be statically coupled to port 1 and port 2 of the spiral structure, but one or more switches may be configured to short out part of the spiral inductor structure by connecting adjacent turns of spiral using a low-impedance "ON" state, thus providing tunability.

Figure 4:
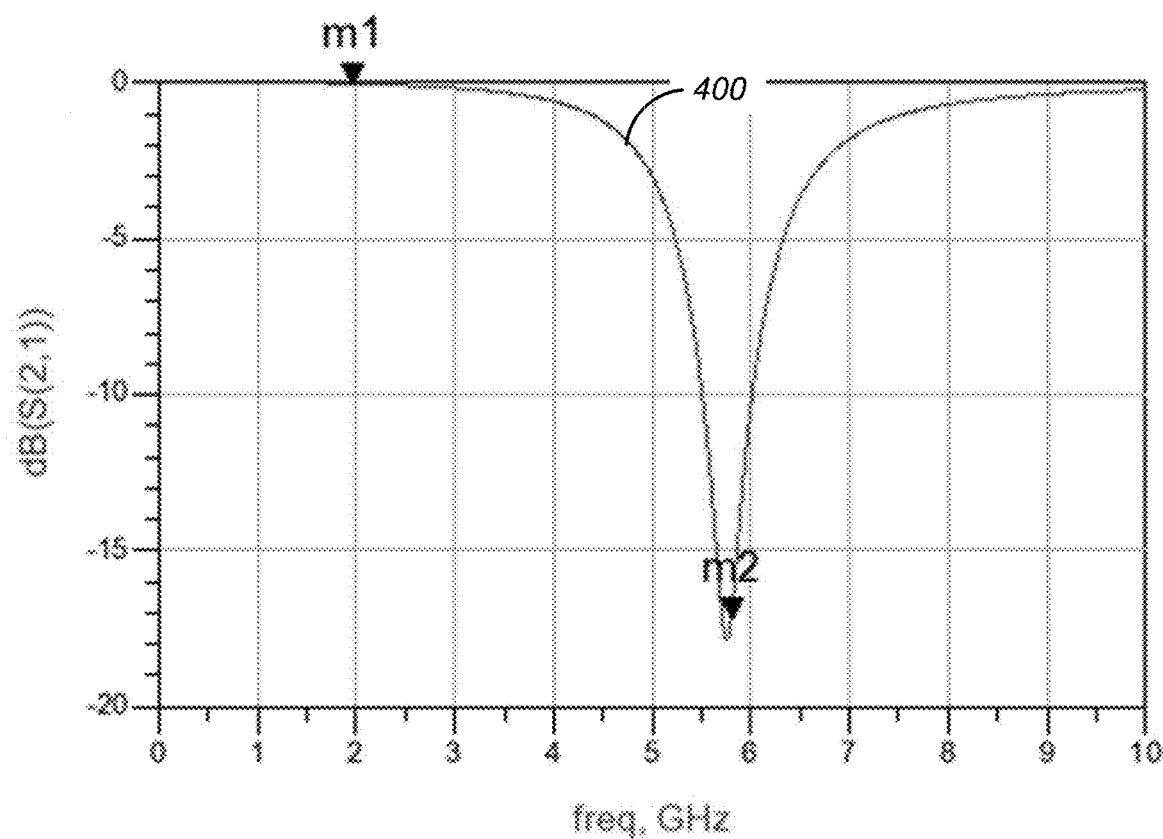
FIG. 4 is a graph of attenuation versus frequency for the notch filter depicted in FIG. 2A.

FIG. 4 is a graph of attenuation versus frequency for the specific notch filter circuit 200 depicted in FIG. 2A (i.e., with the specific component values set forth above). At point m1, the signal power loss (S parameter) from port P1 to port P2 is only about −0.06 dB at about 1.973 GHz, a quite small amount. In contrast, at the center frequency m2 of the notch filter circuit 200, the signal power loss from port P1 to port P2 is about −17.2 dB at about 5.8 GHz. Accordingly, a range of frequencies centered around about 5.8 GHz are effectively suppressed or filtered out of the signal path. As is known in the art, the shape of the notch may be altered by adding additional series inductance to the notch filter circuit, which produces a "sharper" or more abrupt "shoulder" 400 as more inductance is added. As another example, for the tunable notch filter 200 of FIG. 2A, using a larger L1 and smaller C (keeping the L1*C product—and therefore the notch frequency—constant) results in a shallower notch and lower insertion loss at the "shoulder" 400. Larger C and smaller L1 values deepen the notch and increases the insertion loss at the "shoulder" 400. (Note: for the series tunable notch filter 1500 configuration shown in FIG. 15, the opposite result occurs when varying the L and C components).

Frequency-based integrated circuitry is found in a variety of applications, such as modern cellular telephones. In recent years, the complexity of cellular telephones has increased rapidly, moving from dual-band to tri-band, and more recently, to quad-band. In addition, cellular telephones need to be able to accommodate a variety of RF signals for peripheral radios, such as Bluetooth, Wi-Fi, and GPS. This trend is expected to continue as other RF capabilities are added; current "smart phone" cellular telephone architectures have at least seven radios in a single handset. Complexity will continue to rise due to the increased popularity of peripheral radios and functions that also need access to the antenna of a handset. The increased complexity in mobile telephone handset design has greatly complicated the RF front-end by more than tripling the number of high-power signal paths. By its nature, a multiband handset must accommodate a plurality of RF signal paths that all operate on different center frequencies and bandwidths. Yet in many designs, all of the RF signal paths must share access to a small number of antennas (often only one or two). Accordingly, a very efficient solution is to route all of the competing RF signal paths to one or two antennas using an RF switch implemented on an integrated circuit chip.

Figure 5:
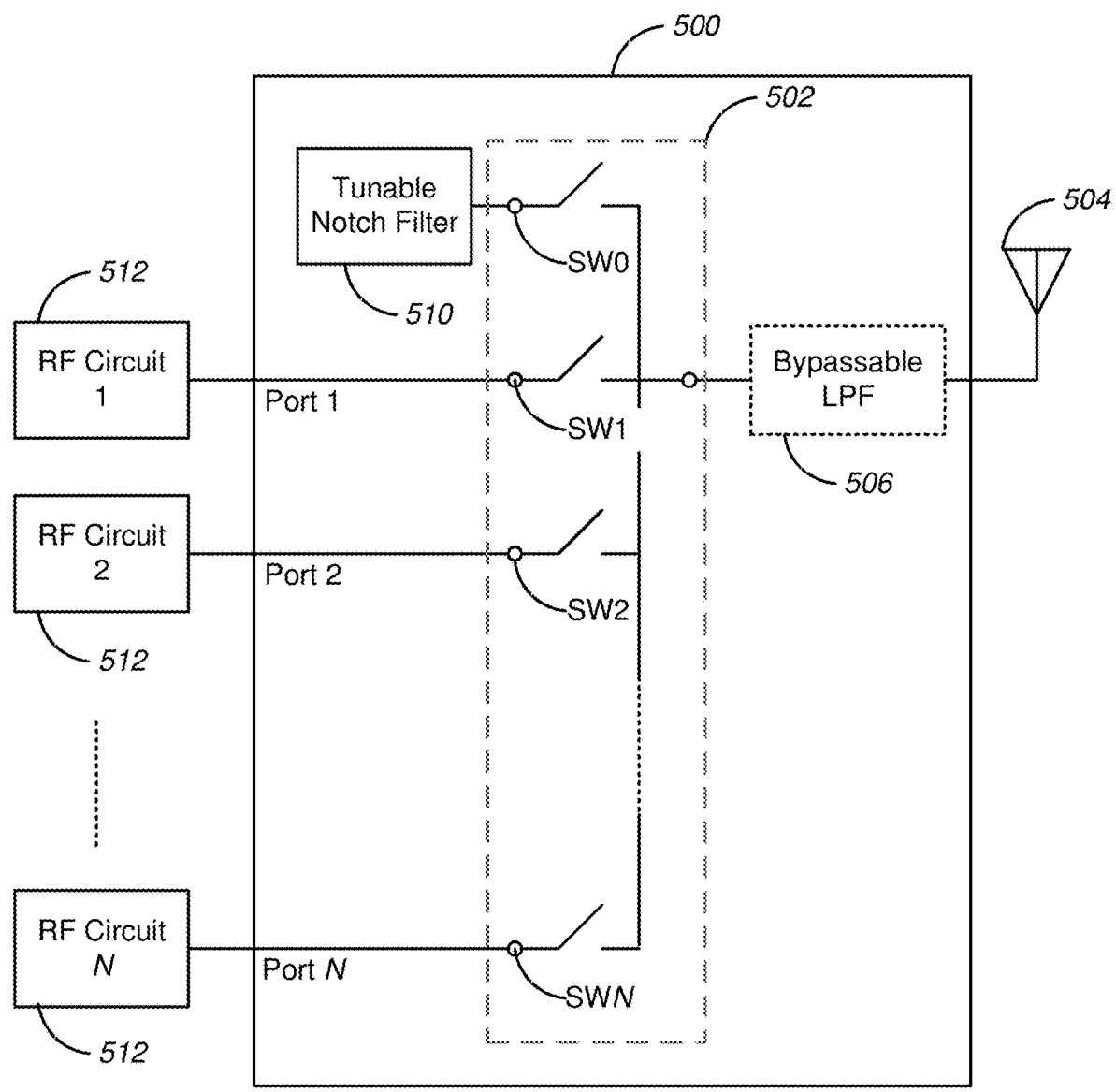
FIG. 5 is a block diagram of an RF switch implemented on an integrated circuit chip in accordance with one aspect of the present invention.

FIG. 5 is a block diagram of an RF switch 502 implemented on an integrated circuit chip 500 in accordance with one aspect of the present invention. The switch 502 may be implemented with FET switch elements as shown in U.S. Pat. No. 6,804,502, issued Oct. 12, 2004 entitled "Switch Circuit and Method of Switching Radio Frequency Signals" and assigned to the assignee of the present invention. In the illustrated embodiment, an antenna 504 is electrically coupled to a common port of switch 502, optionally through a bypassable low pass filter 506 (discussed below). With one antenna 504, the illustrated embodiment is configured for operation across one radio frequency range or "band" typically comprising N sub-bands (which may or may not be adjacent in the RF spectrum encompassed by the band). However, the invention encompasses embodiments that include multiple antennas coupled to corresponding RF switches 502 monolithically integrated onto a single IC chip 500 so as to be operable across multiple radio frequency bands.

In the illustrated embodiment, N signal switch paths or "ports" of the switch 502 are shown coupled to corresponding operational RF circuits 512. The operational RF circuits 512 represent other circuitry, such as RF transmitters and receivers, that may be fabricated on the same IC chip as the switch 502, or that may be located on separate circuit structures (shown as off-chip in FIG. 5). Any of the RF circuits 512 coupled to the ports of the RF switch 502 may be selectively coupled to the antenna 504 in order to transmit and/or receive signals on a corresponding RF sub-band.

At least one switch port of the switch 502 is coupled to a tunable (e.g., via a DTC circuit and/or a tunable inductance circuit) notch filter 510. The switch 502 is designed to couple a selected operational RF circuit 512 to the antenna 504 by activating corresponding switch elements SW1-SWN while simultaneously selectively coupling the associated tunable notch filter 510 to the same signal path through a corresponding switch element SW0. For example, when RF Circuit 2 is coupled by the switch 502 to the antenna 504, switch element SW2 would be closed. If it is desirable to also couple the tunable notch filter 510 to the same signal path in order to provide notch filtering functionality, then switch element SW0 also would be closed. Since the switch 502 needs to be configured to couple at least two ports (including the port coupled to the tunable notch filter 510) to the common port, that functionality may be generalized so that the switch 502 may concurrently couple any combination of the signal ports to the common port.

A number of variants of the integrated circuit chip 500 may be implemented. For example, while only one tunable notch filter 510 is shown coupled to the switch 502 in FIG. 5, additional tunable notch filters 510 may be accommodated in similar fashion, so that multiple frequency bands may be simultaneously filtered out of an operational circuit signal path. In addition, one or more series tunable notch filters may be used in lieu of one or more shunt tunable notch filters, as described in further detail below with respect to FIG. 15. Further, if sufficient circuit area is available, an embodiment may forego the tunability of individual notch filters and instead provide a number of fixed frequency notch filters coupled to multiple ports of a switch 502. Utilizing the switching capability of the switch 502, one or more of such notch filters may be coupled to an operational circuit signal path, thus achieving "tunability" by notch filter circuit selection rather than by tunable component value changes. Accordingly, as defined with respect to the present invention, a "tunable notch filter" includes a structure of multiple selectable integrated fixed frequency notch filters.

For relatively high RF frequency ranges or bands, such as the 2.4 GHz and 5 GHz RF bands commonly used in WiFi wireless local area networks, only relatively small capacitance values are needed to achieve significant notch frequency suppression. Such small values are well suited for implementation on IC chips. For example, utilizing a circuit similar to that shown in FIG. 2A, but with an integrated DTC implementation of the capacitor C, approximately −17.2 dB of frequency suppression centered at about 5.8 GHz can be attained with a (total) value of 0.27 pF for C. In contrast, attempting to achieve such a degree of notch frequency suppression with an external (off-chip) notch filter is extremely difficult, if not impossible, since the necessary tuning capacitance value is small in comparison to all of the parasitic package and circuit capacitances.

While FIG. 5 shows the tunable notch filter 510 as being integrated within the structure of the integrated circuit chip 500 on the signal path side of the switch 502 (i.e., ports 1-N), it may also be advantageous to use one or more integrated tunable notch filters (or bypassable low pass filters, as discussed below) on the common port (antenna) side of the switch. Placing integrated tunable notch filters on the antenna side would allow absorption of residual notch filter capacitance in the switch 502, thus reducing overall signal power loss. Additional inductance may be coupled to the tunable notch filter to better match the impedance of the filter to the circuit as a whole.

Figure 6:
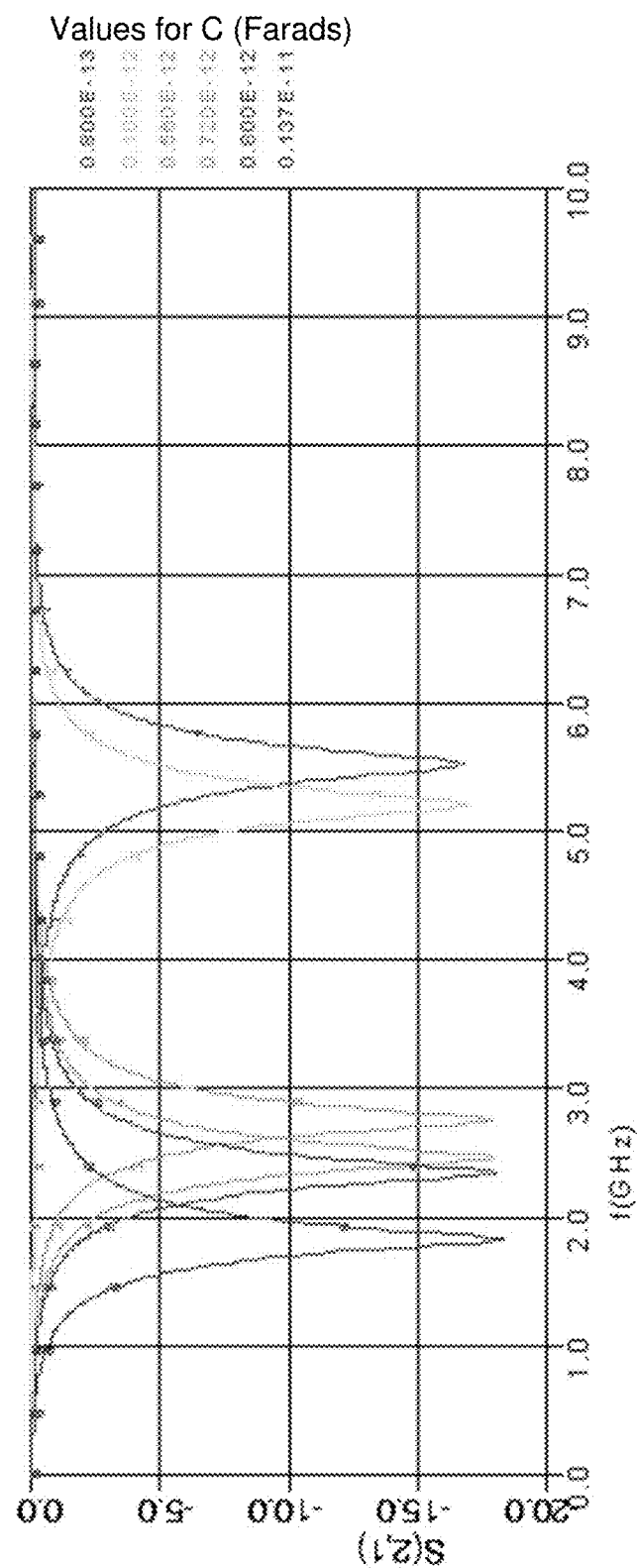
FIG. 6 is a graph of attenuation versus frequency for various capacitance values C of a tunable notch filter in accordance with one aspect of the present invention.

FIG. 6 is a graph of attenuation versus frequency for various capacitance values C of a tunable notch filter in accordance with one aspect of the present invention. Each depicted graph curve is similar to the single graph curve shown in FIG. 4, but all of the depicted curves are achievable using a single tunable notch filter with a variable capacitor, such as a DTC, to vary the values of C in an RLC circuit of the type shown in FIG. 2A. As should be apparent from FIG. 6, by having multiple tunable notch filters incorporated into an integrated circuit chip 500 as shown in FIG. 5, multiple frequency notches can be achieved concurrently. This may be important in many applications where a system's own transmit signal on one band must be suppressed for the receive side of the system concurrently with filtering out environmental "noise" on other received bands.

Figure 7:
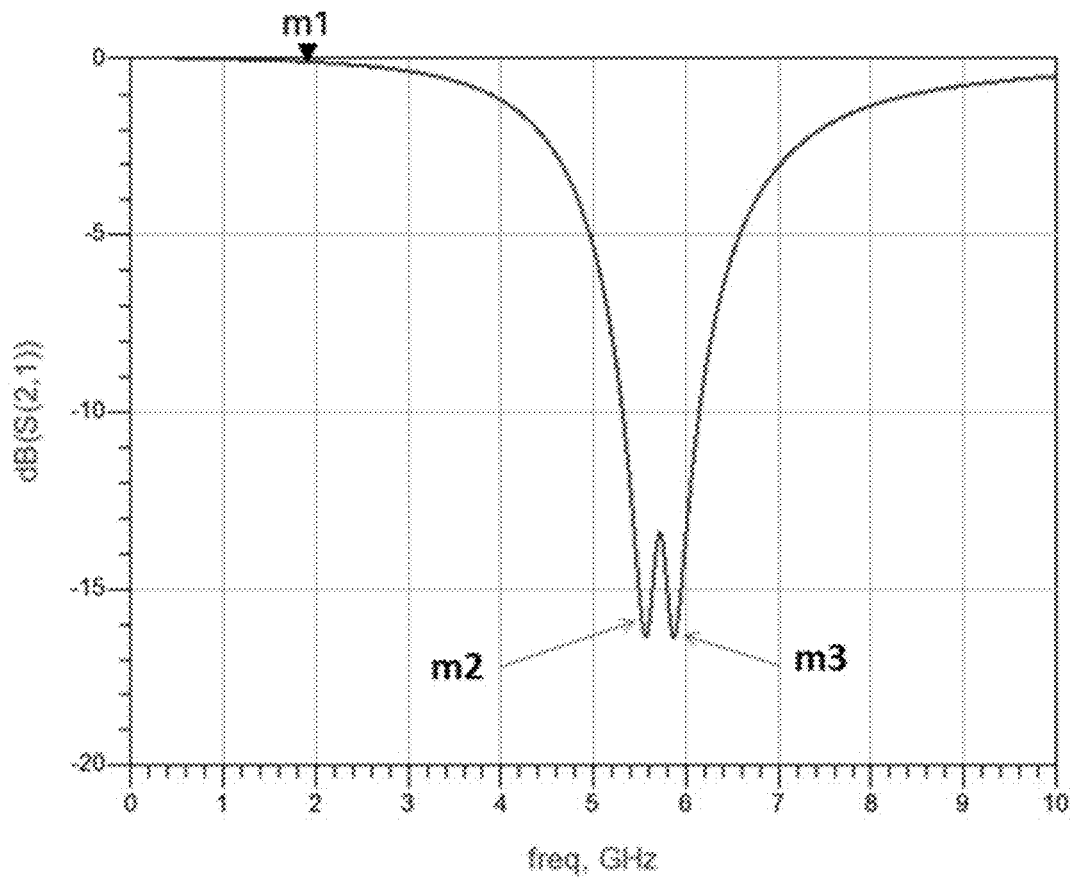
FIG. 7 is a graph of attenuation versus frequency for a pair of notch filters of the type depicted in FIG. 2A.

As noted above, multiple notch filters may be configured as part of one or more RF switches 502 of the type shown in FIG. 5. If two or more such notch filters are configured in parallel with close center suppression frequencies (e.g., by using close values of C), the effect is to widen the notch of filtered frequencies. For example, FIG. 7 is a graph of attenuation versus frequency for a pair of notch filters of the type depicted in FIG. 2A, with C=0.215 pF selected for the first notch filter and C=0.195 pF selected for the second notch filter. Comparing this graph to the graph shown in FIG. 4 (where C in the example notch filter had a value of 0.27 pF) shows that the width of the notch of suppressed frequencies has been widened due to the existence of two minima, m2 and m3. As the difference in C values grows, the paired notch filters will suppress different (and eventually non-overlapping) ranges of frequencies. A similar effect can be achieved by varying the inductance value of the pair of RLC notch filters. Of course, more than two notch filters may be implemented to provide an even wider frequency suppression notch and/or to provide multiple separate and/or overlapping frequency suppression notches.

Figure 8:
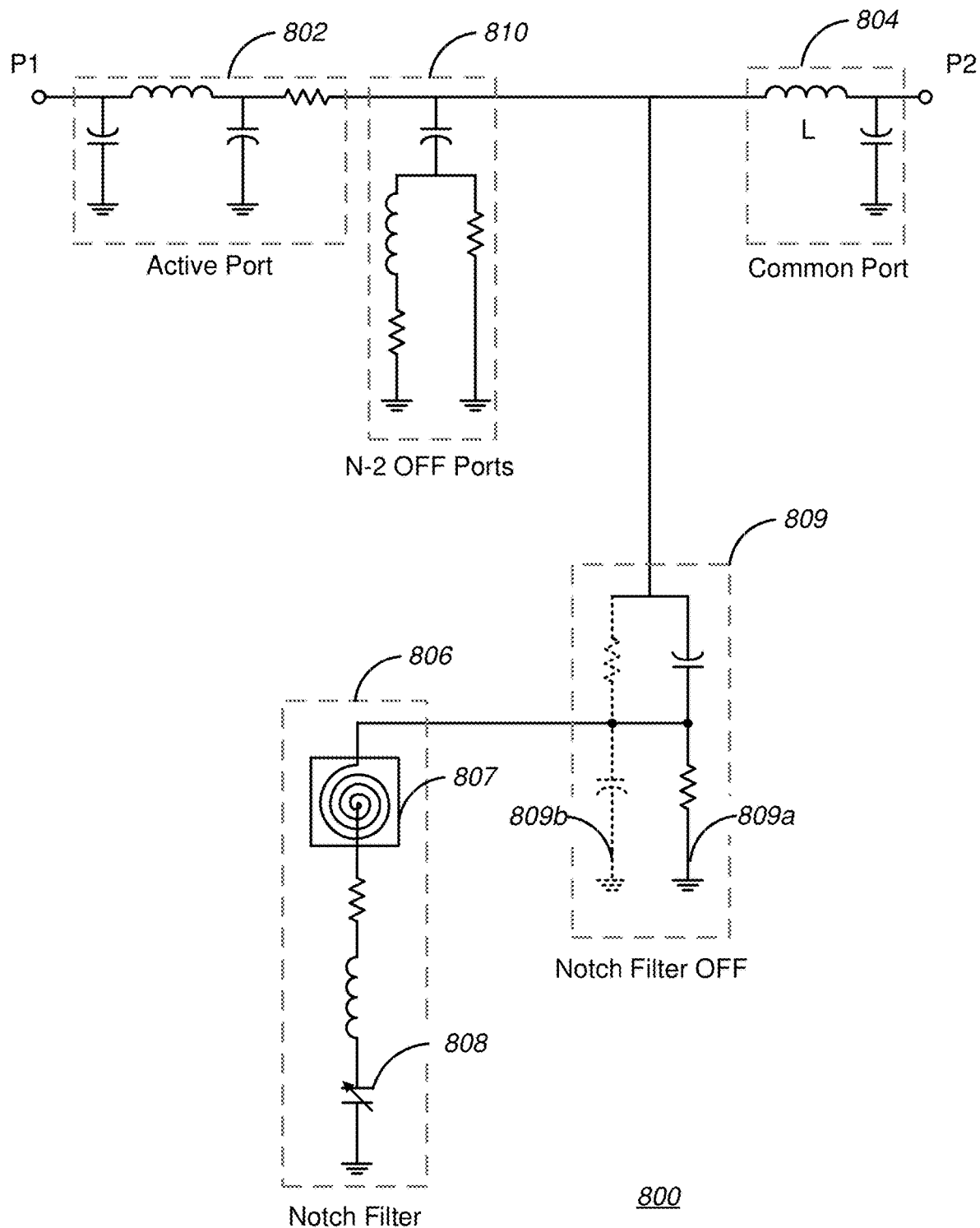
FIG. 8 is a schematic RLC-model diagram of tunable notch filter in an "OFF" state, integrated with an RF switch circuit in an IC chip in accordance with one aspect of the present invention.

FIG. 8 is a schematic RLC-model diagram of tunable notch filter in an "OFF" state, integrated with an RF switch circuit 800 in an IC chip in accordance with one aspect of the present invention. An active ("ON") port P1 for the switch 800 comprises a switch (e.g., a FET) that is modeled as an RLC network in block 802. The values of the modeled components will of course vary with the application and circuit specifications. A common port P2 for the switch 800, used for example for connections to an antenna, is shown with LC components in block 804 for tuning out the P1 to P2 circuit capacitance for matching purposes; the inductor L may be off-chip if need be.

In the illustrated embodiment, a tunable notch filter 806 that includes an inductor 807 (shown as a spiral inductor in this example) and a tunable capacitor 808 may be coupled to the P1-P2 signal path by means of a selective switching structure 809, shown here modeled as alternative RC pathways which may be implemented, for example, as FETs. In the configuration shown in FIG. 8, the tunable notch filter 806 is "OFF": circuit path 809a is switched into connection with the P1-P2 signal path, and circuit path 809b (shown in dotted lines) is switched out of connection with the P1-P2 signal path. The result is that the tunable notch filter 806 is shunted to ground and the switching structure 809 appears as an open circuit to the P1-P2 signal path (i.e., at RF frequencies, the active capacitor in block 809 behaves as an open circuit). (For clarity, note that the selective switching structure 809 comprises only two components, each of which behaves as either a resistance or a capacitance based on the state of a control signal, not shown. Circuit path 809a in FIG. 8 shows one state of the two components; circuit path 809b in FIG. 10 shows the other state of the two components).

Also attached to the P1-P2 signal path are the "OFF" (non-active) ports 810 of the RF switch circuit 800. Importantly for practical concerns, all of the "OFF" ports of the switch 800, while theoretically disconnected from the P1-P2 signal path, in fact still present a parasitic RLC network load due to the nature of semiconductor IC fabrication. For example, as noted above, the switch 800 elements may be implemented with FETs. However, "open", non-conductive FETs still present a measurable capacitance to coupled circuits. In the embodiment illustrated in FIG. 8, for an N-port switch 800 with one active port and only one tunable notch filter 809, there are N–2 "OFF" ports. An important aspect of the present invention is that integrating one or more tunable notch filters within an RF switch allows optimization of both the RF switch and the tunable notch filters so that the residual and other parasitic impedance in the circuitry and package associated with both parts can be synergistically absorbed and compensated. For example, the actual capacitor structures needed for the RLC notch filter can be made smaller than the desired effective capacitance values, thereby "absorbing" the parasitic capacitance of the associated switch circuitry and IC package, which add to the total value of C for the notch filter structure. As another example, compensation for the RF switch 800 shown in FIG. 8 is achieved by properly sizing the inductors in blocks 802 and 804 for a particular application to offset or "match" the capacitance of the "OFF" ports in block 810 and of the tunable notch filter and bypass switch components in blocks 806 and 809, so that the P1 to P2 signal path looks like a 50-ohm transmission line. Such compensation reduces the insertion loss impact of the RF switch 800.

Figure 9:
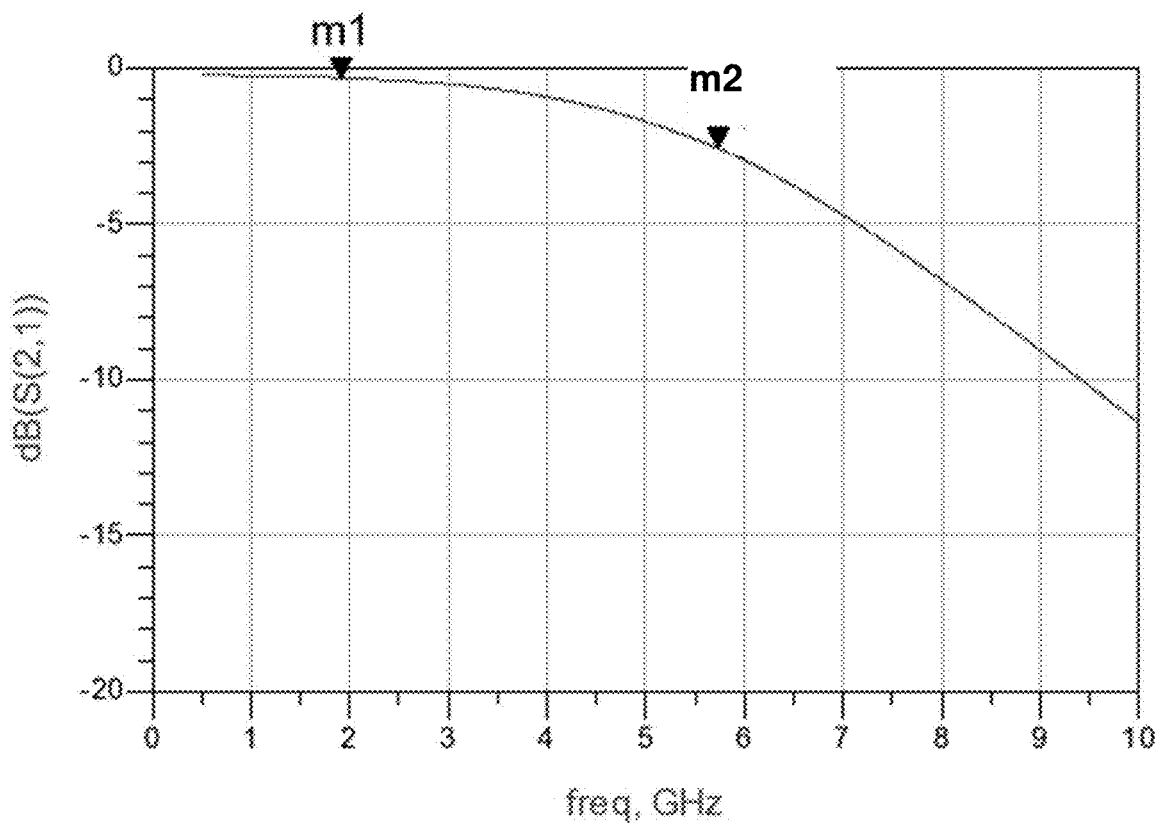
FIG. 9 is a graph of attenuation versus frequency for an embodiment of a tunable notch filter integrated with an RF switch of the type and state depicted in FIG. 8.

FIG. 9 is a graph of attenuation versus frequency for an embodiment of a tunable notch filter integrated with an RF switch of the type and state (i.e., notch filter "OFF") depicted in FIG. 8. The signal power loss (S parameter) from port P1 to port P2 increases gradually with frequency, but no notch filter function is apparent.

Figure 10:
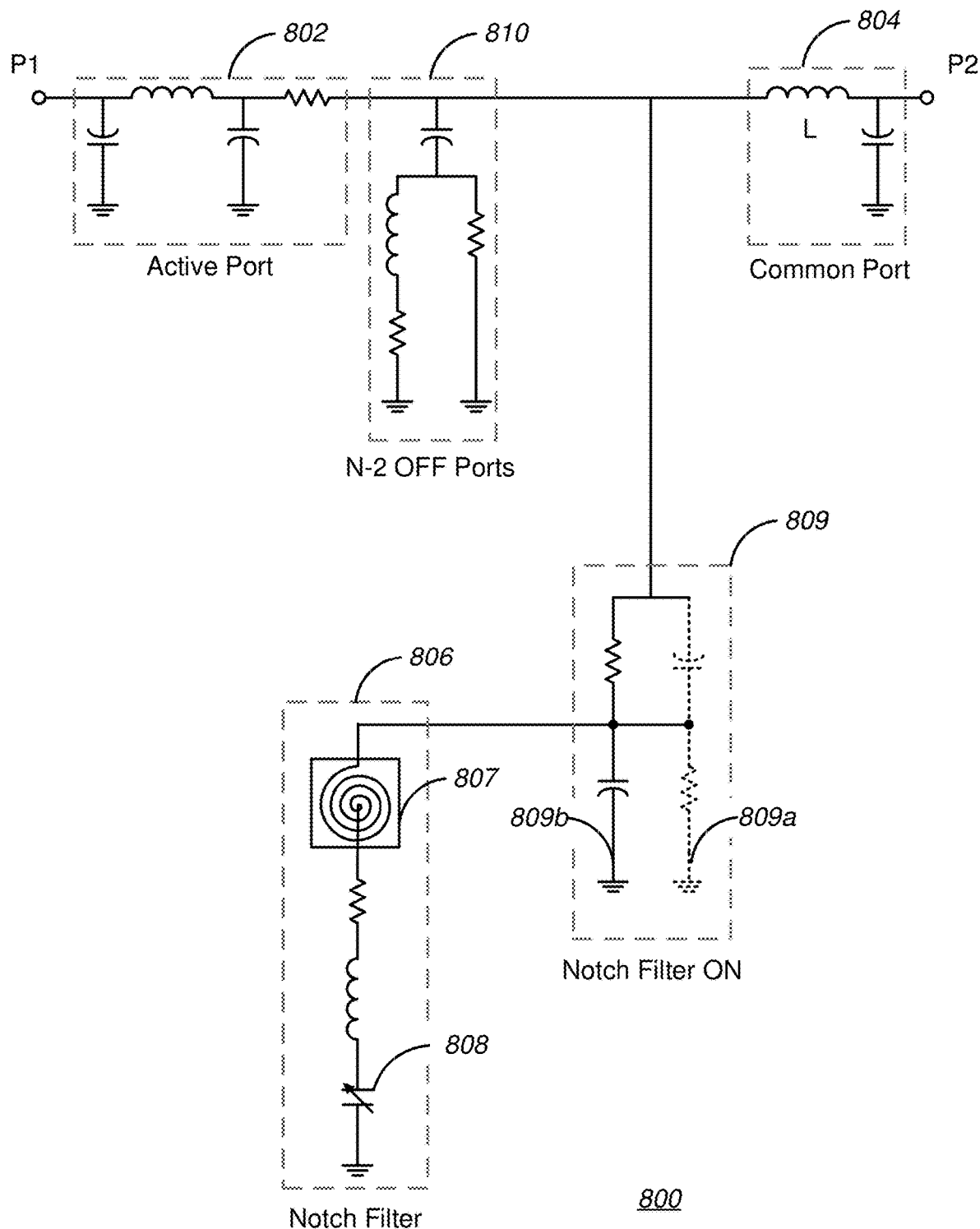
FIG. 10 is a schematic RLC-model diagram of the circuit of FIG. 8 with the tunable notch filter in an "ON" state.

FIG. 10 is a schematic RLC-model diagram of the circuit of FIG. 8 with the tunable notch filter in an "ON" state. In this example, the tunable notch filter 806 is "ON": circuit path 809a (shown in dotted lines) is switched out of connection with the P1-P2 signal path, and circuit path 809b is switched into connection with the P1-P2 signal path. The result is that the tunable notch filter 806 is resistively coupled to the P1-P2 signal path, thus permitting notch frequency suppression.

Figure 11:
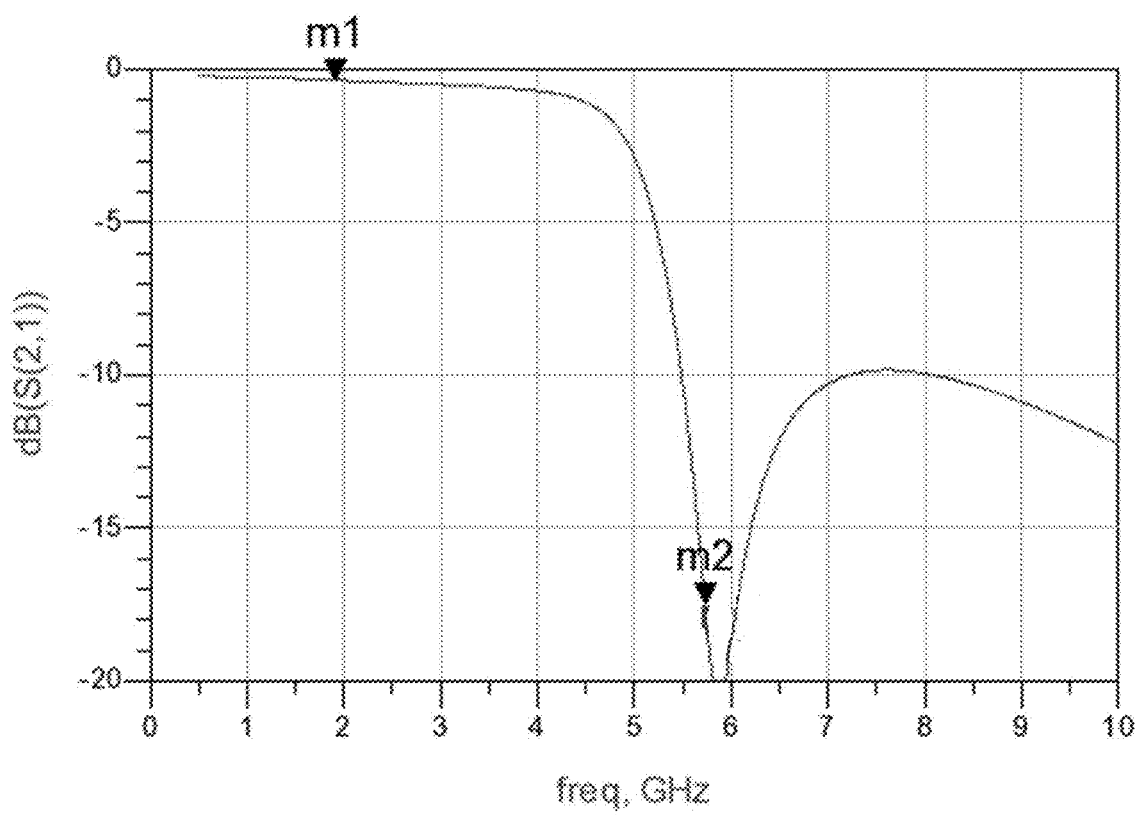
FIG. 11 is a graph of attenuation versus frequency for an embodiment of a tunable notch filter integrated with an RF switch of the type and state depicted in FIG. 10.

FIG. 11 is a graph of attenuation versus frequency for an embodiment of a tunable notch filter integrated with an RF switch of the type and state depicted in FIG. 10. The signal power loss (S parameter) from port P1 to port P2 increases gradually with frequency until about 5 GHz, where the notch filter function becomes readily apparent. Notably, in the embodiment represented by FIG. 11 and with the values used to achieve the illustrated curve characteristics, the insertion loss impact of the RF switch with integrated tunable notch filter is only about 0.03 dB (i.e., the difference between the loss at m1 in FIG. 9 and the loss at m1 in FIG. 11), due to the ability to compensate for and absorb residual and other parasitic inductance. An off-chip implementation of a notch filter would result in a significantly larger insertion loss, typically in excess of 0.5 dB, more than a factor of 10 larger than with embodiments of the present invention.

The embodiments shown in FIGS. 8 and 10 allow the tunable notch filter 806 to be actively switched onto or off of the P1-P2 signal path as needed by suitable control circuitry (not shown). In an alternative embodiment, the tunable notch filter 806 may remain electrically connected to the P1-P2 signal path, but have its filtering characteristics tuned (e.g., by using a DTC and minimizing its capacitance) as needed by suitable control circuitry to move its center suppression frequency to a band that is outside the range of interest for a particular RF system (in effect, "detuning" the filter). A further embodiment allows for tuning the notch filter to a minimum capacitance state when it is in its OFF state (i.e., when the switch port to the notch filter is not engaged), in order to reduce losses through the filter RLC structure. Accordingly, a tunable notch filter may be either switched ON (electrically connected) while physically connected to a signal path in order to perform filtering, or functionally activated while constantly electrically and physically connected to a signal path in order to perform filtering.

Figure 12:
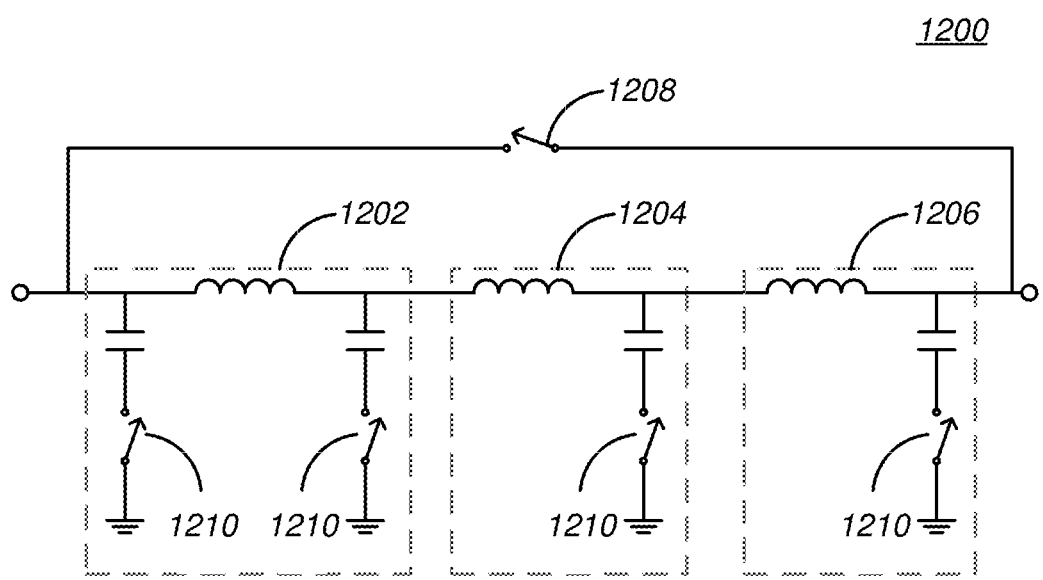
FIG. 12 is a schematic diagram of a low pass filter structure suitable for use with the present invention in place of the tunable notch filter shown in FIG. 5.

As should be apparent from FIG. 11, if the only frequencies being transmitted or received (e.g., around point m1) are solely in a lower range than interfering frequencies, an integrated low pass filter can be used in place of the notch filter shown in FIG. 5. FIG. 12 is a schematic diagram of a low pass filter structure 1200 suitable for use with the present invention in place of the tunable notch filter 510 shown in FIG. 5. Shown is a conventional 3-element CLC low pass filter 1202. A 5-element LC low pass filter can be implemented by adding another LC stage 1204, and a 7-element LC low pass filter can be implemented by adding another LC stage 1206. The low pass filter structure 1200 is optionally tunable. For example, one or more of the capacitors in each stage may be implemented with a DTC to allow tuning of the cut-off frequency of the low pass filter. In an alternative embodiment, one or more of the inductors in the LC stages may be tunable to allow tuning of the cut-off frequency of the low pass filter. The bypass switch 1208 and the shunt switches 1210 allow the low pass filter stages to be enabled (by opening bypass switch 1208 and closing the shunt switches 1210) or bypassed (by closing bypass switch 1208 and opening the shunt switches 1210).

Figure 13:
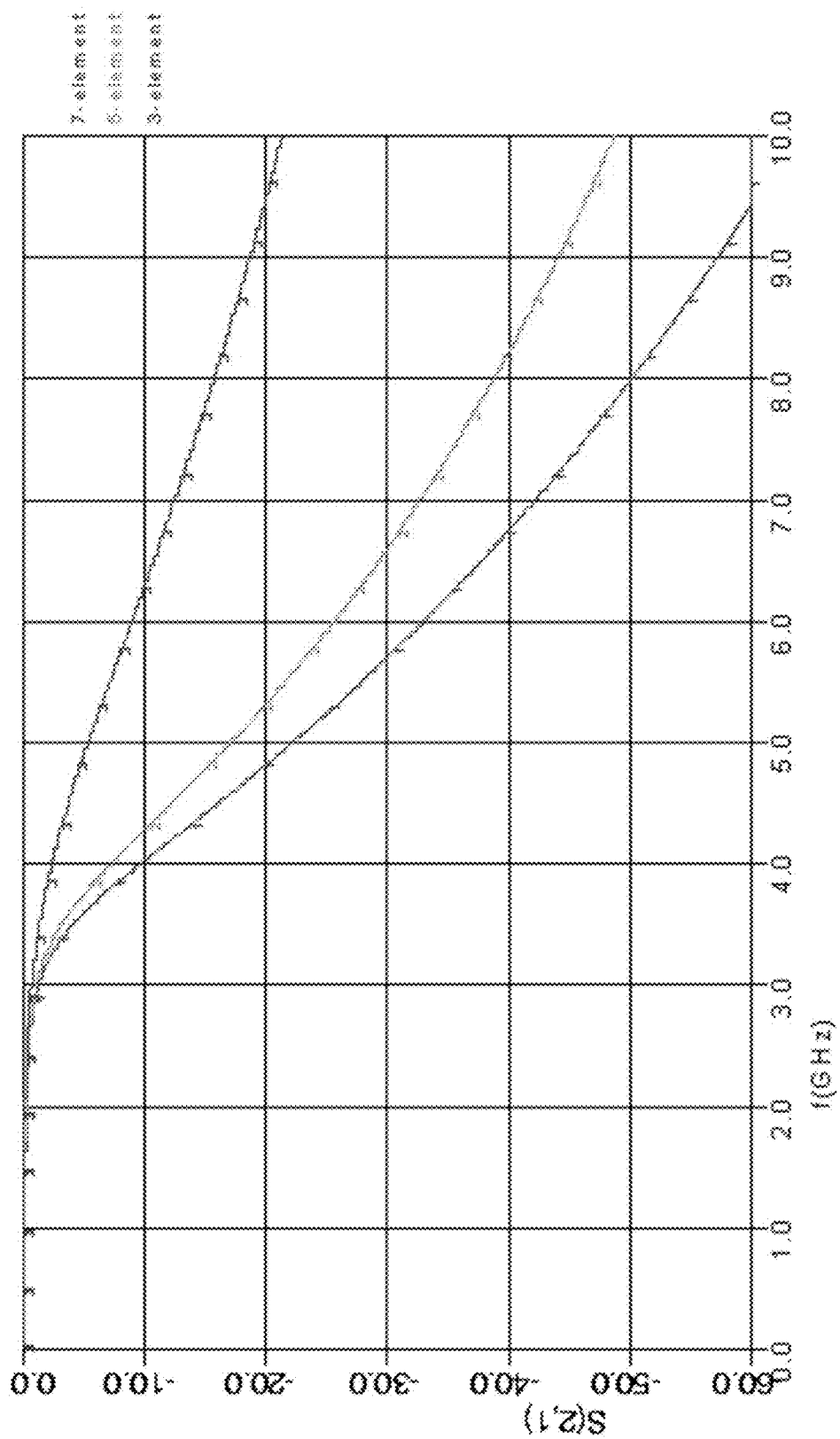
FIG. 13 is a graph of attenuation versus frequency for the low pass filter structure depicted in FIG. 12.

FIG. 13 is a graph of attenuation versus frequency for the low pass filter structure 1200 depicted in FIG. 12. As can be seen, low pass filters with more elements provide a more abrupt cut-off of high frequencies, at the cost of additional components. As with the tunable notch filter, a low pass filter would normally be switched off of the P1-P2 signal path when not in use. Similarly, a low pass filter may be tuned to reduce loss when not in use by moving the cut-off point to a frequency band outside the range of interest. The resulting integrated switch and filter structure also exhibits low insertion losses.

Figure 14:
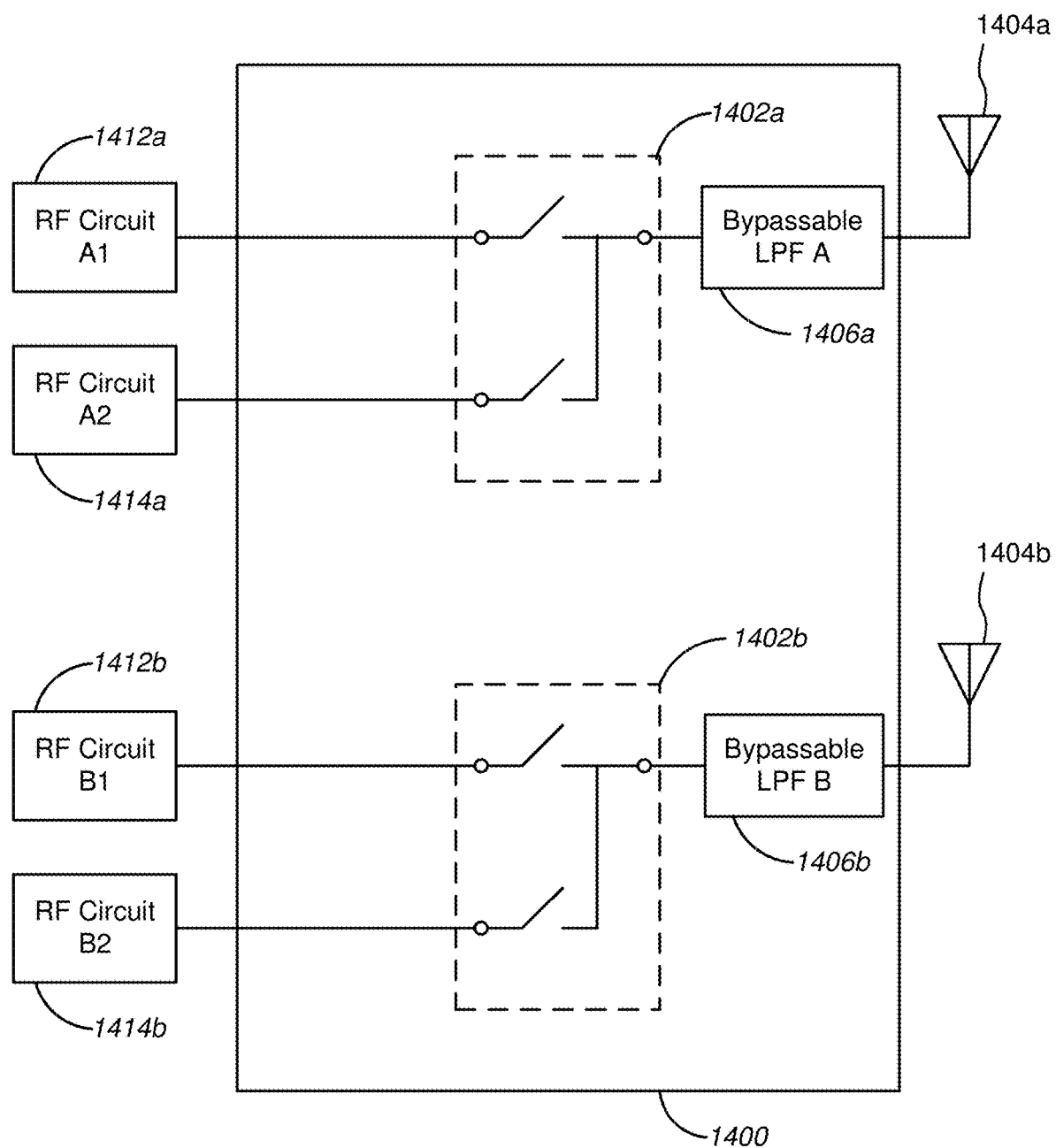
FIG. 14 is a block diagram of another embodiment of a pair of RF switches implemented on an integrated circuit chip in accordance with aspects of the present invention.

FIG. 14 is a block diagram of another embodiment of a pair of RF switches implemented on an integrated circuit chip 1400 in accordance with aspects of the present invention. The illustrated circuit is similar to the circuit shown in FIG. 5, but includes two RF switches 1402a, 1402b coupled by means of common ports to corresponding antennas 1404a, 1404b through associated bypassable low pass filters 1406a, 1406b. This is a similar configuration to one embodiment described above in which tunable notch filters are situated on the common (antenna) side of their corresponding RF switch. The RF switches 1402a, 1402b can selectively couple one or more associated RF circuits 1412a, 1412b to an associated antenna 1404a, 1404b. The bypassable low pass filters 1406a, 1406b are selectively enabled or bypassed in the manner described with respect to FIG. 12. If needed for impedance matching, one or more inductors (not shown) can be switched into the operational signal path when a low pass filter 1406a, 1406b is bypassed.

Variants of the invention include combining multiple aspects of the described embodiments. For example, referring to FIG. 5, a bypassable low pass filter of the type shown in FIG. 12 can be included in a switch circuit of the type shown in FIG. 5. In particular, an optional bypassable low pass filter 506 is shown coupled to the common port of the RF switch 502. When engaged, the bypassable low pass filter 506 can filter out a broad range of interfering high frequencies that may adversely affect all of the RF circuits 512, while the tunable notch filter 510 can filter out selected frequency bands within the lower range of frequencies admitted by the low pass filter 506. If desired, the bypassable low pass filter 506 may also be made tunable.

As another variant of the circuit shown in FIG. 5, the optional bypassable low pass filter 506 may be replaced by a bypassable series tunable notch filter, and the tunable notch filter 510 may be omitted or alternatively used in combination with the bypassable series tunable notch filter. In an alternative configuration, one or more signal ports may include a dedicated bypassable series tunable notch filter.

Figure 15:
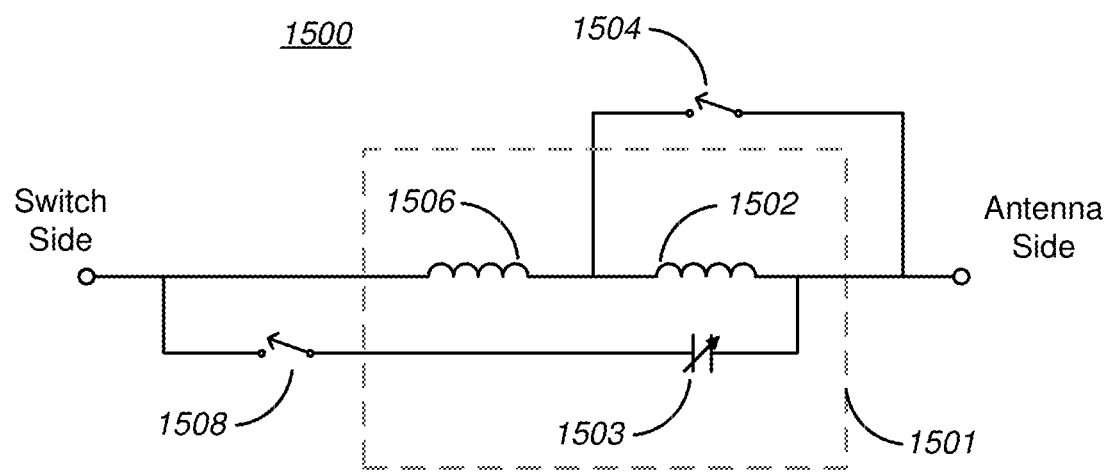
FIG. 15 is a schematic circuit diagram of one embodiment of a bypassable series tunable notch filter.

FIG. 15 is a schematic circuit diagram of one embodiment of a bypassable series tunable notch filter 1500 which is preferable to the shunt notch filter circuit 200 shown in FIG. 2A in some applications. A tunable notch filter element 1501 comprising a primary inductor 1502, a capacitor 1503, and a residual matching inductor 1506 coupled as shown operates in a manner similar to the notch filter of FIG. 2A to suppress a narrow range of frequencies. Either or both of the primary inductor 1502 or the capacitor 1503 are tunable in order to select a center suppression frequency. In the illustrated embodiment, the capacitor 1503 is shown as tunable, and may be, for example, a DTC of the type described in U.S. patent application Ser. No. 12/735,954 cited above. As another example, a multi-tap tunable inductor as described above with respect to FIG. 3 may be used for the primary inductor 1502 of the tunable notch filter element 1501, series connected as shown.

In FIG. 15, an inductor bypass switch 1504 and a notch enable switch 1508 allow the notch filter element 1501 to be effectively removed from the circuit if no filtering function is needed. The inductor bypass switch 1504 is OPENED and the notch enable switch 1508 is CLOSED when the notch filter element 1501 is to be operative (enabled). When the notch filter element 1501 is to be inoperative (disabled, i.e., no filtering), the inductor bypass switch 1504 is CLOSED and the notch enable switch 1508 is OPENED. As a practical matter, the bypass switch 1504 and the notch enable switch 1508 should have a low resistance when "ON" so as to maintain low insertion loss. When the notch filter element 1501 is disabled, the primary inductor 1502 is shorted and the capacitor 1503 is disconnected. In that condition, the residual matching inductor 1506 remains in the circuit path between the switch side and the antenna side. The residual matching inductor 1506 should be sized appropriately to emulate a 50-ohm transmission line and minimize insertion loss when the notch filter element 1501 is disabled. When the notch filter element 1501 is enabled, both the primary inductor 1502 and the residual matching inductor 1506 form part of the tunable notch filter element 1501, along with the capacitor 1503. With the capacitor 1503 thus connected, the primary inductor 1502 and the residual matching inductor 1506 are sized appropriately to emulate a 50-ohm line and minimize insertion loss at the signal transmission frequency.

Figure 16:
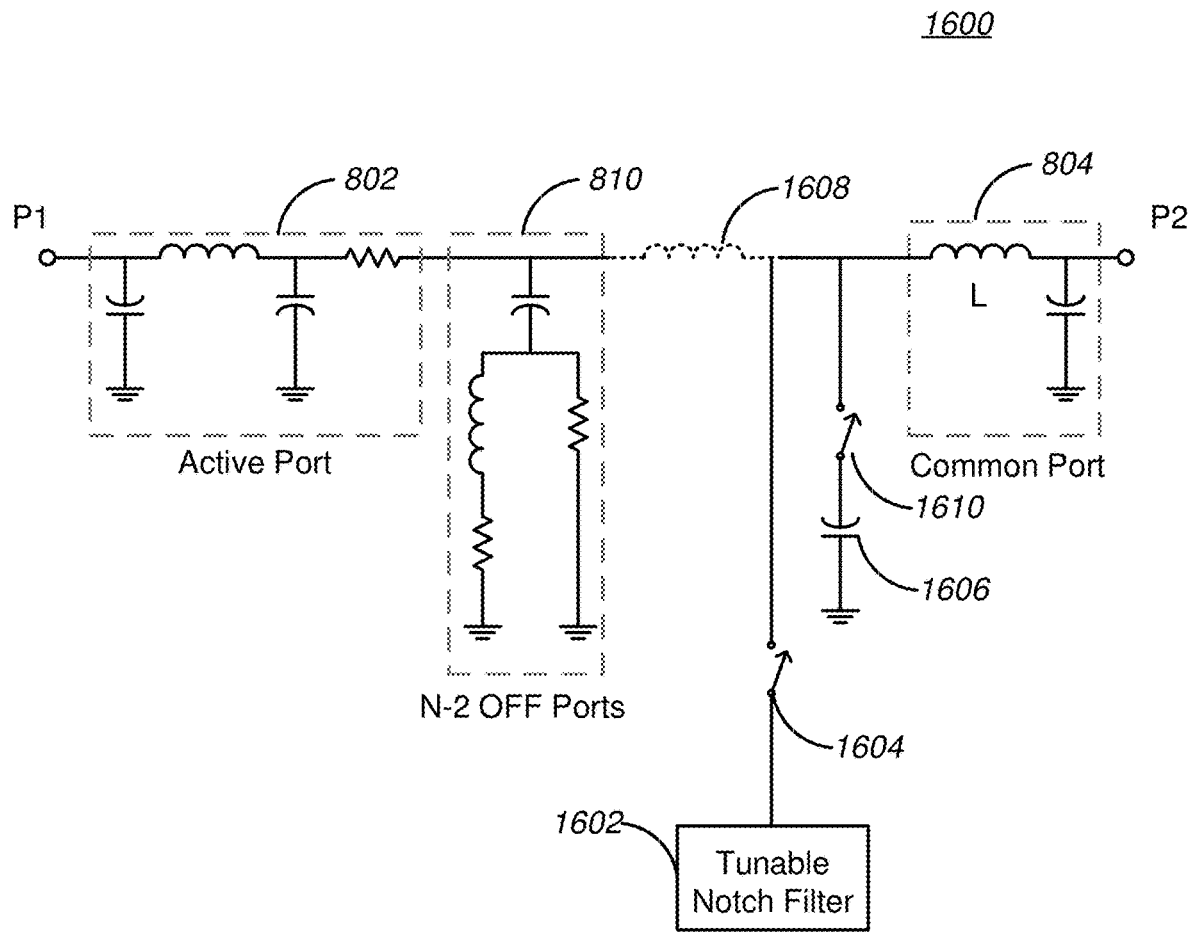
FIG. 16 is a schematic RLC-model diagram of one embodiment of a switching circuit that includes a tunable filter and bypass switch, an added bypassable compensation capacitor, and an added tuning inductor.

For particular implementations of the embodiments of the invention, special care may be taken to mitigate the influence of added tunable filter components. For example, FIG. 16 is a schematic RLC-model diagram of one embodiment of a switching circuit 1600 that includes a tunable filter 1602 and bypass switch 1604, an added bypassable compensation capacitor 1606, and an added tuning inductor 1608. The switching circuit 1600 is similar to the circuits shown in FIG. 8 and FIG. 10, but simplified to show a tunable filter 1602 (e.g., a tunable notch filter or a tunable low pass filter) as a single element. For applications particularly sensitive to impedance matching, when the tunable filter 1602 is bypassed by opening switch 1604, an optional second switch 1610 concurrently closes to couple the optional compensation capacitor 1606 onto the same signal path. Doing so ensures that the capacitance to ground, when the tunable filter 1602 is disconnected, is the same as the effective capacitance to ground at the transmitted frequency, when the tunable filter 1602 is connected. This enables minimum insertion loss (in a 50-ohm system) by emulating a 50-ohm transmission line, regardless of the connected or disconnected state of the tunable filter 1602.

More particularly, a perfect (distributed) 50-ohm line is characterized by sqrt(L/C)=50 ohms, where L and C are the inductance and capacitance per unit length, respectively. In a circuit having lumped inductance L and capacitance C, minimum-loss transmission in a 50-ohm system is still achieved when sqrt(L/C) is on the order of 50 ohms. In FIG. 16, the inductance of the signal path resides primarily in the combination of tuning inductor 1608, the inductor L within block 804, and the inductance of active port 802. When activated by bypass switch 1604, tunable filter 1602 is almost a zero impedance at the filter frequency, but is capacitive at the frequency being transmitted. The inductance values of tuning inductor 1608 and the inductor L within block 804 are chosen to give a 50-ohm line at the frequency being transmitted, with the tunable filter 1602 activated. To preserve a 50-ohm line when the tunable filter 1602 is not activated, closing switch 1610 inserts compensation capacitor 1606 onto the signal path. The value of compensation capacitor 1606 is selected to match—and thus substitute for—the effective capacitance of the tunable filter 1602 at the transmitted signal frequency when the tunable filter 1602 is activated.

FIG. 16 also shows an optional tuning inductor 1608 that may be added to help tune out excess capacitance in the switching circuit 1600. Doing so makes it easier to tune the P1-P2 signal path to be a near-ideal 50-ohm transmission line.

It may be beneficial in some applications to physically locate a tunable filter (notch or low pass) closer to an antenna port. It may also be advantageous in some applications to provide a bypass switch for such a tunable filter that is separate from the RF switch (element 502 in FIG. 5) but still integrated on the same IC die or in the same IC package. Among other advantages, such a configuration enables easy adaptation of the inventive concepts to existing circuit designs for such RF switches.

Figure 17:
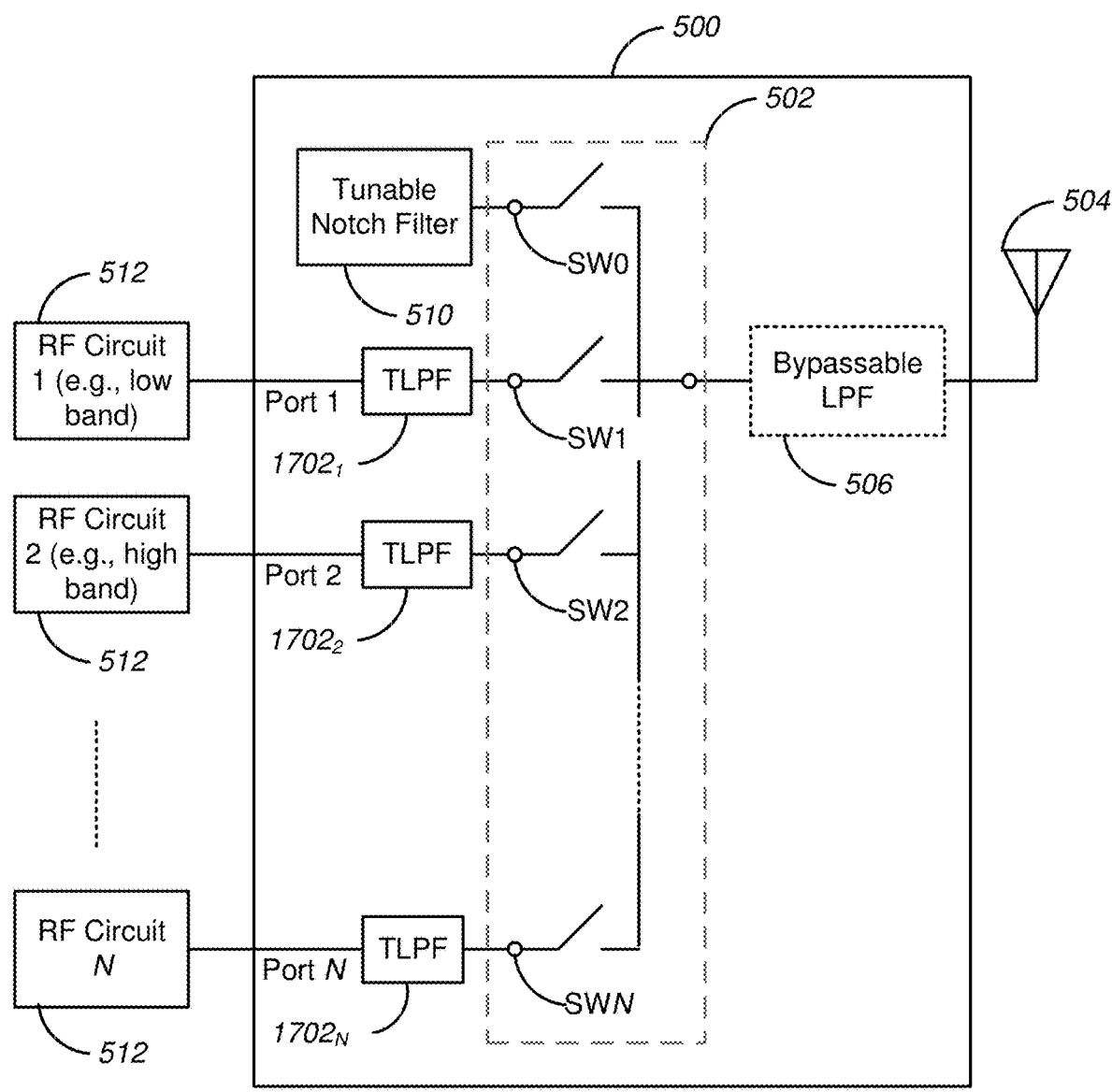
FIG. 17 is a block diagram of an RF switch configuration implemented on an integrated circuit chip in accordance with one aspect of the present invention.

Another variant of the inventive concept that provides additional functionality and flexibility includes the use of tunable low pass filters on the port side of an RF switch. For example, FIG. 17 is a block diagram of an RF switch configuration implemented on an integrated circuit chip 500 in accordance with one aspect of the present invention. The integrated circuit chip 500 is essentially the same as the circuit of FIG. 5, with the addition of one or more tunable low pass filters (TLPF) $1702_1$-$1702_N$ formed on the IC chip 500 before one or more corresponding switch elements SW1-SWN. The TLPF's help filter out harmonic frequencies from an associated RF signal path. In some applications, only two of the ports may need TLPFs; for example, in GSM radio systems, TLPF's may only be desirable on a low band RF path and a high band RF path. Accordingly, the remaining RF circuit paths need not have TLPFs added on the integrated circuit chip 500.

Figure 18:
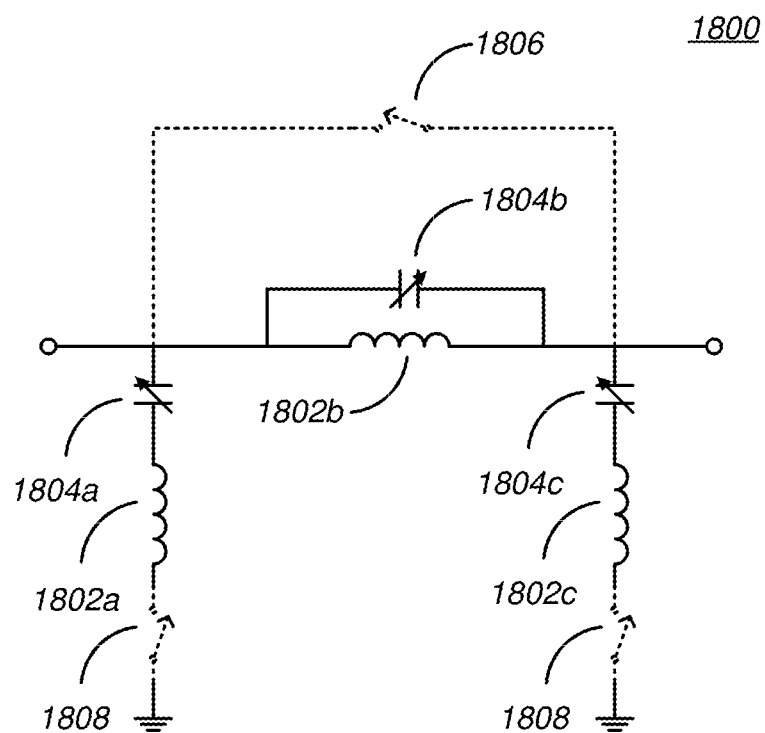
FIG. 18 is a schematic diagram of one embodiment of a tunable low pass filter circuit that may be used for the tunable low pass filter elements shown in FIG. 17.

FIG. 18 is a schematic diagram of one embodiment of a tunable low pass filter circuit 1800 that may be used for the tunable low pass filter elements shown in FIG. 17. In the illustrated embodiment, inductors 1802a-1802c and capacitors 1804a-1804c form a variant of the well-known shunt-serial-shunt "pi" type low pass filter, and tunability of the illustrated filter circuit is achieved by using variable capacitors. For example, one or more of the capacitors 1804a-1804c may be implemented with a DTC to allow tuning of the cut-off frequency of the tunable low pass filter 1800. In addition, in the illustrated circuit, adjusting the capacitors 1804a-1804c (not necessarily by the same amount) serves not only to tune the cut-off frequency, but also the "notches" at harmonic frequencies (for example, the 2nd and 3rd harmonics in this example) beyond the cut-off frequency to provide harmonic suppression. In an alternative embodiment, one or more of the inductors 1802a-1802c may be tunable to allow tuning of the cut-off frequency of the low pass filter. As an option that may be useful for some applications, addition of a bypass switch 1806 and a pair of shunt switches 1808 allows the tunable low pass filter to be enabled (by opening bypass switch 1806 and closing the shunt switches 1808) or bypassed (by closing bypass switch 1806 and opening the shunt switches 1808). If the shunt switches 1808 are not included, the corresponding inductors 1802a, 1802c would be connected directly to circuit ground in the illustrated circuit. As should be apparent to those skilled in the art, other low pass filter designs may be useful for various applications, so long as they are tunable. While FIG. 18 shows a typical shunt-serial-shunt "pi" type LPF, low pass filter designs are not limited to shunt-serial-shunt architectures. For example, a simple serial-shunt L-type LPF may be used, like stages 1204 and 1206 shown in FIG. 12.

Existing circuits known as "antenna switch modules" (ASMs) include an RF switch with harmonic filters. However, the filters are each designed for a specific frequency band, and therefore multiples of such filters are required in a system that transmits or receives signals in multiple frequency bands. Further, process variations (MIM capacitance value, bond-wire length, etc.) during the manufacture of ASMs cause shifts in filtering parameters, degrade product quality, and increase design challenges. In particular, having to design around such process variations leads to long product-to-market time and higher engineering costs due to multiple design iterations to optimize filter performance.

In contrast, integrating one or more TLPF's and an RF switch into an integrated circuit chip 500, as shown in FIG. 17, results in an ASM that allows post-manufacture tuning of each port equipped with a TLPF and the broader ability to handle multiple frequency bands. For process variation tuning, a relatively small range of tunability may be suitable, and may be accomplished, for example, by varying bias inputs of the tunable capacitors of the TLPFs (see FIG. 18) via a digital interface to the integrated circuit chip 500 so that each TLPF can be controlled individually. In some cases, it may be desirable to allow the customer to do all calibration and tuning when the integrated circuit chip 500 is embedded in a final circuit, in order to optimize the tuning of the integrated circuit chip 500 to take into account the various external parasitic RLC elements of the complete environment in which the chip is embedded. A customer could also customize or tune the amount of attenuation needed for a particular radio (with the radios different by design or different due to process or part variations).

Figure 19:
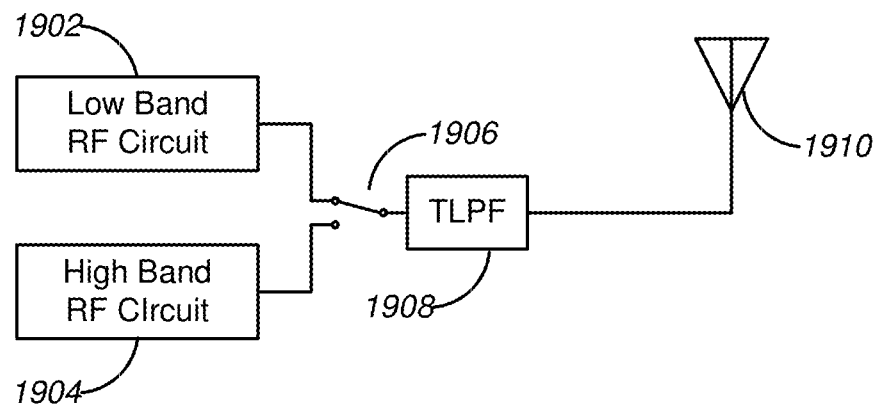
FIG. 19 is a block diagram of a shared tunable low pass filter for an RF circuit configuration in accordance with one aspect of the present invention.

If tunable capacitors or tunable inductors with a sufficiently wide tuning range are incorporated into a TLPF, so that the TLPF has a wide range of variability in its cut-off frequency, then a single TLPF may be used in conjunction with a simple switch to provide harmonic filtering of multiple RF bands. For example, FIG. 19 is a block diagram of a shared tunable low pass filter for an RF circuit configuration 1900 in accordance with one aspect of the present invention. In the illustrated embodiment, a low band RF circuit 1902 and a high band RF circuit 1904 are coupled through a single-pole, double-throw switch 1906 to a wide-band TLPF 1908, which may be, for example, of the type shown in FIG. 18. The TLPF 1908 in turn is coupled to an antenna 1910. By selecting the state of the switch 1906, one of the low band RF circuit 1902 and the high band RF circuit 1904 are coupled to the antenna 1910 through the TLPF 1908. The TLPF 1908 is electrically tuned to a cut-off frequency suitable to the selected RF circuit, thereby allowing a single wide-band TLPF to filter unwanted frequencies relative to the frequency band of the selected RF circuit (the control circuitry is not shown). While FIG. 19 shows only two RF bands, the concepts embodied in the illustration extend to more than two RF bands by using a multi-throw switch 1906 and a TLPF 1908 with a suitably wide tuning range.

The teachings above with respect to tunable low pass filters apply as well to tunable high pass filters (THPFs), as would be apparent to one skilled in the art. Referring to FIG. 18, the TLPF shown can be converted to a THPF by removing inductor 1802b. Of course, other high pass filter designs may be useful for various applications, so long as they are tunable. Both tunable low pass filters and tunable high pass filters are useful, for example, in RF duplexers and diplexers. A diplexer is typically used to separate high band and low band signals from a single antenna. This typically involves large frequency separation between the high frequency band and the low frequency band. Note that both transmit and receive signals flow through the high frequency section and the low frequency section, so the diplexer does not have an impact on the duplexing method. A duplexer is typically used to isolate proper transmission and receive paths from one common antenna path, and allows frequency division duplexing, where transmission and reception occur simultaneously on a common antenna. In both cases, the basic circuitry is the same, although duplexer's typically require "sharper" filters, making them more difficult to design in integrated circuit form. The discussion below focuses on duplexers, but applies as well to diplexers.

Figure 20:
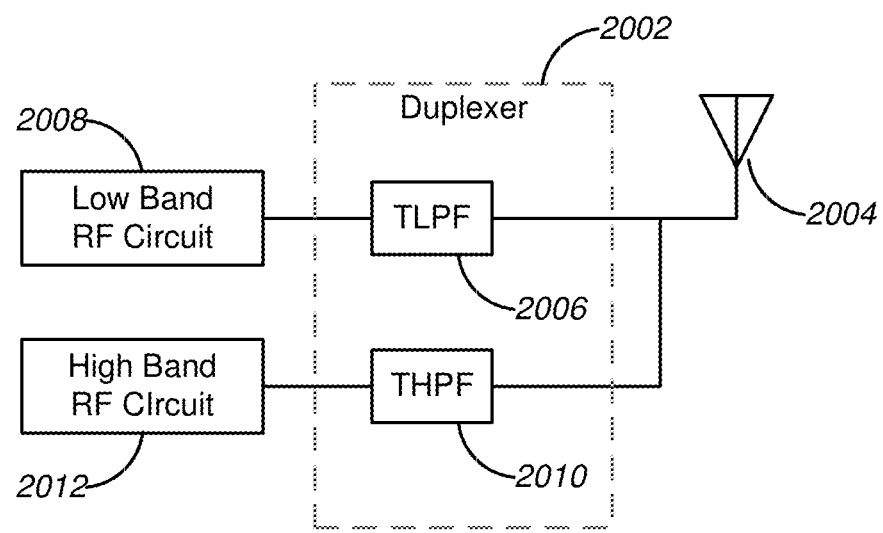
FIG. 20 is a block diagram of one embodiment of a tunable RF duplexer incorporating both a tunable low pass filter and a tunable high pass filter.

Duplexers typically include a high pass filter and a low pass filter and need to cover a wide range of frequency bands, which increases the challenge of designing such duplexers using fixed filtering elements, especially in a miniature integrated form. In a typical RF front-end architecture, a fixed duplexer cannot provide impedance match well with the antenna in all of the supported frequency bands, and therefore additional impedance matching network elements are needed. Such problems are resolved by a tunable duplexer that includes both a TLPF for filtering a low-band RF path and a THPF for filtering a high-band RF path. The cut-off frequencies (and most signal rejection notches) of both tunable filters can be shifted as needed by means of a control interface to accommodate signals in different frequency bands. As an example, FIG. 20 is a block diagram of one embodiment of an RF duplexer 2002 incorporating both a tunable low pass filter and a tunable high pass filter. An antenna 2004 is coupled through a TLPF 2006 to a low band RF circuit 2008, and through a THPF 2010 to a high band RF circuit 2012. The combination of the TLPF 2006 and the THPF 2010 effectively form a tunable notch filter to provide band rejection for the RF frequencies between the low band and the high band.

As would be apparent one of skill in the art, the teachings above with respect to tunable notch filters also apply to tunable bandpass filters. A tunable bandpass filter may implemented as a low pass filter, such as the type shown in FIG. 12, coupled in series to a capacitor, with one or more of the inductors or capacitors implemented with tunable components, as described above. Alternatively, a THPF and a TLPF can be combined so as to effectively form a tunable bandpass filter to provide band admittance. One or more tunable bandpass filters may be used in various RF circuits where it is more advantageous to admit rather than reject a selectable band of frequencies.

As noted previously, an important aspect of the present invention is that the tunable notch or bandpass filters or tunable low or high pass filters are fabricated within the same IC package as the associated frequency based circuitry; in the examples shown in the accompanying figures, such circuitry comprises an RF switch, but other circuitry may be used. Such integration reduces or eliminates package and printed circuit board (PCB) RLC parasitic values, and also allows residual and other parasitic capacitance, inductance, and resistance in the associated circuitry and package to be absorbed and compensated. For example, such integration, particularly if a DTC is also integrated on the same chip to provide the desired tunability, reduces parasitic capacitances from such sources as IC pad shielding "cages", electrostatic discharge (ESD) circuits, and the IC package itself. Importantly, integration of tunable filters in an IC results in a total insertion loss that is less than the total insertion loss that would exist if the tunable filters were external to the IC. Accordingly, the invention encompasses co-designing a frequency based circuit and one or more tunable filters such that the overall performance of the integrated combination is better than the simple combination of separate components performing the same functions.

Other advantages of integration of tunable filters is that they can handle large signal levels and have low distortion, which are requirements for use in many RF circuits, such as an RF radio front end.

As should be readily apparent to one of ordinary skill in the art, various embodiments of the invention can be implemented to meet a wide variety of possible frequency suppression specifications. Thus, selection of suitable R, L, and C values (taking into account parasitic values resulting from IC implementation) are a matter of design choice. The switching and passive elements may be implemented in any suitable IC technology, including but not limited to MOSFET and IGFET structures. Integrated circuit embodiments may be fabricated using any suitable substrates and processes, including but not limited to standard bulk silicon, silicon-on-insulator (SOI), and silicon-on-sapphire (SOS) processes.

Another aspect of the invention includes a method for selectively filtering unwanted frequencies from a signal path of a frequency based integrated circuit, including the steps of:
  STEP 1: fabricating at least one tunable filter and a frequency based circuit in an integrated circuit package;
  STEP 2: coupling at least one tunable filter to a signal path of the frequency based circuit;
  STEP 3: configuring the frequency based circuit and each tunable filter to absorb and compensate for residual and other parasitic impedance present in the frequency based circuit integrated;
  STEP 4: selectively activating at least one coupled tunable filter to filter unwanted frequencies from the signal path of the frequency based integrated circuit.

Another aspect of the invention includes methods for coupling, configuring, and operating circuit elements as shown in the various figures and described above.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:
1. An integrated circuit including:
   (a) a frequency-based circuit having a common signal path;
   (b) at least one tunable filter coupled to the common signal path of the frequency-based circuit, wherein each tunable filter is configured to be selectively activated to filter unwanted frequencies from the common signal path of the frequency-based circuit; and
   (c) at least one bypassable compensation capacitor circuit, each coupled in parallel with a corresponding tunable filter and configured to match and substitute for an effective capacitance of such tunable filter when such tunable filter is not activated;
wherein the frequency-based circuit and each tunable filter are located on a single integrated circuit chip.

2. The integrated circuit of claim 1, wherein at least one tunable filter includes at least one of a tunable notch filter or a tunable bandpass filter.

3. The integrated circuit of claim 2, wherein the tunable notch filter or tunable bandpass filter includes a tunable RLC filter.

4. The integrated circuit of claim 3, wherein the tunable RLC filter includes at least one of a tunable capacitor C and a tunable inductor L.

5. The integrated circuit of claim 4, wherein at least one of the tunable capacitor C or tunable inductor L is digitally tunable.

6. The integrated circuit of claim 1, wherein at least one tunable filter includes at least one of a tunable low pass filter or a tunable high pass filter.

7. The integrated circuit of claim 6, wherein the tunable low pass filter or tunable high pass filter includes a tunable RLC filter.

8. The integrated circuit of claim 7, wherein the tunable RLC filter includes at least one of a tunable capacitor C and a tunable inductor L.

9. The integrated circuit of claim 8, wherein at least one of the tunable capacitor C or tunable inductor L is digitally tunable.

10. The integrated circuit of claim 1, wherein the frequency-based circuit is at least one of a radio frequency switch, a radio frequency duplexer, or a radio frequency diplexer.

11. The integrated circuit of claim 1, wherein at least one tunable filter includes multiple selectable fixed frequency notch filters.

12. The integrated circuit of claim 1, wherein at least one tunable filter is selectively settable to a minimum filtering state when its filtering function is not needed.

13. The integrated circuit of claim 1, wherein the frequency-based circuit and each tunable filter are co-designed to absorb and compensate for residual and other parasitic impedances present in the integrated circuit, and wherein the co-designed frequency-based circuit and at least one tunable filter have a total insertion loss that is less than the total insertion loss that would exist if such tunable filter was external to the integrated circuit.

14. The integrated circuit of claim 1, further including a bypassable low-pass filter coupled to the common signal path for filtering out a broad range of high frequencies that may adversely affect the frequency-based circuit.

15. An integrated circuit including:
(a) a frequency-based circuit having a signal path; and
(b) at least one digitally tunable filter coupled to the signal path of the frequency-based circuit, wherein each digitally tunable filter is configured to be selectively activated to filter unwanted frequencies from the signal path of the frequency-based integrated circuit and wherein at least one digitally tunable filter includes at least one of a digitally tunable low pass filter or a digitally tunable high pass filter;
wherein the frequency-based circuit and each digitally tunable filter are located on a single integrated circuit chip.

16. The integrated circuit of claim 15, further including a bypassable low-pass filter coupled to the signal path for filtering out a broad range of high frequencies that may adversely affect the frequency-based circuit.

17. The integrated circuit of claim 15, wherein at least one digitally tunable filter includes at least one of a digitally tunable notch filter or a digitally tunable bandpass filter.

18. The integrated circuit of claim 15, wherein the frequency-based circuit and each digitally tunable filter are co-designed to absorb and compensate for residual and other parasitic impedances present in the integrated circuit, and wherein the co-designed frequency-based circuit and at least one digitally tunable filter have a total insertion loss that is less than the total insertion loss that would exist if such digitally tunable filter was external to the integrated circuit.

19. The integrated circuit of claim 15, wherein at least one digitally tunable filter is selectively settable to a minimum filtering state when a filtering function thereof is not needed.

* * * * *